(12) United States Patent
Mayama

(10) Patent No.: US 7,063,192 B2
(45) Date of Patent: Jun. 20, 2006

(54) ACTIVE VIBRATION SUPPRESSION APPARATUS, CONTROL METHOD THEREFOR, AND EXPOSURE APPARATUS HAVING ACTIVE VIBRATION SUPPRESSION APPARATUS

(75) Inventor: Takehiko Mayama, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 454 days.

(21) Appl. No.: 09/990,350

(22) Filed: Nov. 23, 2001

(65) Prior Publication Data

US 2002/0104950 A1    Aug. 8, 2002

(30) Foreign Application Priority Data

Nov. 27, 2000 (JP) .............................. 2000-359969
Jan. 10, 2001 (JP) .............................. 2001-002436

(51) Int. Cl.
*A47G 31/11* (2006.01)
*A47G 27/00* (2006.01)

(52) U.S. Cl. .................. 188/378; 267/136; 248/550
(58) Field of Classification Search ............... 267/136, 267/140.14, 140.15; 188/280, 378; 248/550, 248/636, 637

See application file for complete search history.

(56) References Cited

U.S. PATENT DOCUMENTS

RE33,937 E * 5/1992 Schubert ..................... 267/136
5,812,958 A    9/1998 Mayama ..................... 701/111
5,862,894 A *  1/1999 Boichot et al. ............. 188/280
6,155,542 A   12/2000 Kato et al. .................. 267/136
6,170,622 B1   1/2001 Wakui et al. ............... 188/378
6,322,060 B1  11/2001 Mayama et al. ............. 267/136
2001/0040324 A1 11/2001 Mayama et al. ............. 267/136

FOREIGN PATENT DOCUMENTS

| JP | 11-151141  | 6/1999  |
| JP | 11-190786  | 7/1999  |
| JP | 11-294520  | 10/1999 |
| JP | 2000-122731| 4/2000  |

* cited by examiner

Primary Examiner—Matthew C. Graham
(74) Attorney, Agent, or Firm—Fitzpatrick, Cella, Harper & Scinto

(57) ABSTRACT

An active vibration suppression apparatus includes an actuator fixed to a vibration suppression target, an inertial load driven relative to the target by the actuator, and a driving system which drives the actuator based on a first signal corresponding to the vibration, generated or to be generated, of the target. The driving system includes a compensation unit which performs a compensation for the first signal. The compensation, separately or as a composite compensation includes (i) a linear compensation for the first signal to obtain a first compensated signal, and (ii) a nonlinear compensation for the first compensated signal to obtain a second compensated signal. A rate of a change in the second compensated signal to a change in an absolute value of the first compensated signal becoming less with an increase of the absolute value.

10 Claims, 23 Drawing Sheets

FIG. 21

| | |
|---|---|
| URL | http://www.maintain.co.jp/db/input.html |

TROUBLE DB INPUT WINDOW

DATE OF OCCURRENCE  2000/3/15  ~404
MODEL  * * * * * * * * *  ~401
SUBJECT  OPERATION FAILURE (START-UP ERROR)  ~403
EQUIPMENT S/N  465NS4580001  ~402
URGENCY  D  ~405
SYMPTOM  LED KEEPS BLINKING AFTER POWER-ON  ~406
REMEDY  POWER ON AGAIN (PRESS RED BUTTON AT POWER-ON)  ~407
PROGRESS  TEMPORARY MEASURE HAS BEEN TAKEN  ~408

[SEND] [RESET]        410                       411                        412
LINK TO RESULT LIST DATABASE    SOFTWARE LIBRARY    OPERATION GUIDE

FLOW CHART OF SEMICONDUCTOR DEVICE MANUFACTURING PROCESS

ACTIVE VIBRATION SUPPRESSION APPARATUS, CONTROL METHOD THEREFOR, AND EXPOSURE APPARATUS HAVING ACTIVE VIBRATION SUPPRESSION APPARATUS

FIELD OF THE INVENTION

The present invention relates to an active vibration suppression method and apparatus which are suited to realizing the excellent performance of an apparatus by stably and quickly suppressing vibrations such as rigid-body vibrations and structural resonance produced in a structure forming a semiconductor exposure apparatus, an exposure apparatus using the same, and the like.

BACKGROUND OF THE INVENTION

With an increase in the precision of a semiconductor exposure apparatus, a vibration isolation/suppression apparatus with higher performance has been required. In a semiconductor exposure apparatus, in particular, it is required to prevent vibrations that affect exposure from being produced in an exposure stage or a structure forming an exposure apparatus body. For this purpose, the exposure apparatus body must be insulated from external vibrations, including vibrations from an apparatus mount pedestal such as a floor, as much as possible, and vibrations produced when equipment, having a driving means such as an X-Y stage mounted on the apparatus main body, operates, must be quickly reduced.

If structural resonance vibrations are produced in apparatus/equipment mounted on the exposure apparatus body, and a sufficient damping property is not ensured, these resonance vibrations must also be effectively reduced/suppressed to prevent them from affecting the apparatus performance.

In the semiconductor exposure apparatus, in particular, the intermittent, repetitive operation, called step-and-repeat, of the exposure stage apparatus or scanning operation for scanning exposure excites vibrations, in the apparatus body. The drive reaction force generated by the stage apparatus and the load movement of the stage apparatus excite vibrations in equipment or a structure that forms the apparatus body. For a vibration isolation/suppression apparatus in this field, therefore, it is essentially required to insulate the apparatus body from external vibrations including vibrations from an apparatus mount pedestal such as a floor, and to effectively reduce/suppress rigid-body vibrations and resonance vibrations produced in the apparatus body when the equipment mounted on the apparatus body operates. In a scan exposure apparatus, in particular, since exposure is performed while an exposure stage apparatus performs a scanning operation, severe requirements are imposed on vibration reduction/suppression performance. Therefore, a vibration isolation/suppression apparatus with higher performance becomes indispensable.

To satisfy such a requirement, various types of active vibration isolation/suppression apparatuses have been developed and put into practice, which detect the vibrations of a vibration isolation base on which a semiconductor exposure apparatus is mounted by using a sensor, to compensate for the resultant detection signal for the vibrations, and to feed back the resultant signal to each actuator for applying a control force to the vibration isolation base, thereby actively suppressing vibration.

As a conventional vibration isolation/suppression apparatus for a semiconductor exposure apparatus, an active vibration isolation apparatus based on the vibration isolation leg scheme for reducing/suppressing the vibrations of the vibration isolation base by using a support mechanism for vibration-suppressing/supporting the vibration isolation base has been widely used. More specifically, a vibration isolation apparatus has been widely used, which controls the vibrations of the vibration isolation base by using actuators formed by air springs for supporting the vibration isolation base on an apparatus mount pedestal or a combination of such air springs and electromagnetic actuators that are placed dynamically parallel to the air springs to apply a control force between the vibration isolation base and the apparatus mount pedestal.

An active vibration isolation apparatus of this type and a semiconductor exposure apparatus using this vibration isolation apparatus are disclosed in "Vibration Isolation Apparatus, Exposure Apparatus and Device Manufacturing Method using the Same, and Vibration Isolation Method", Japanese Patent Laid-Open No. 11-294520 proposed by the present applicant. According to this prior art, an active vibration isolation apparatus configured to reduce/suppress the vibrations of a vibration isolation base is disclosed, which uses air springs, as air actuators, which support the vibration isolation base on an apparatus mount pedestal, and also uses electromagnetic linear motors for applying a control force between the vibration isolation base and the apparatus mount pedestal. In this apparatus, each actuator is controlled on the basis of a signal obtained by detecting any displacement, acceleration, or the like, of the vibration isolation base using a sensor and performing a compensation computation for the signal, such as a signal being obtained by compensating for a signal from equipment having a driving means such as an X-Y stage mounted on the vibration isolation base, a signal being obtained by detecting the vibrations of the apparatus mount pedestal and performing a compensation computation for the resultant signal, or the like. This apparatus realizes excellent vibration isolation/suppression performance, which the active vibration isolation apparatus based on the pneumatic driving scheme widely used in the past does not have, by respectively allocating control functions to air actuators capable of easily obtaining a large thrust and electromagnetic actuators with excellent response properties in consideration of the merits of the two types of actuators.

An active vibration suppression apparatus, called an active mass damper or a countermass, tends to be used in the field of precision vibration control as well, which is designed to perform vibration control more finely than such an active vibration isolation apparatus based on the vibration isolation leg scheme and to realize more sophisticated vibration isolation/suppression control by driving an inertial load serving as a weight by using an actuator and using the resultant drive reaction force as a control force.

Such conventional active vibration suppression apparatuses are disclosed in "Active Vibration Suppression Apparatus and Semiconductor Exposure Apparatus Using the Same", Japanese Patent Application No. 11-151141 filed by the present applicant, "Stage Apparatus, Exposure Apparatus using the Same, and Device Manufacturing Method", Japanese Patent Laid-Open No. 11-190786, "Active Vibration Suppression Apparatus", Japanese Patent Application No. 2000-122731 filed by the present applicant, and the like. Methods and apparatuses for reducing/suppressing vibrations are also disclosed in these references.

FIG. 17 is a perspective view for explaining the structure of a vibration suppression apparatus proposed as "Active Vibration Suppression Apparatus and Semiconductor Exposure Apparatus Using the Same", Japanese Patent Application No. 11-151141. This vibration suppression apparatus is configured to drive a mass serving as a weight in the straight direction by using an actuator for generating a thrust in the straight direction. The apparatus shown in FIG. 17 suppresses vibrations in the vertical direction.

This apparatus is comprised of a linear-acting actuator 81 such as an electromagnetic linear motor and an inertial load 82 driven by the linear-acting actuator 81 in the straight direction. FIG. 17 shows an example of the apparatus using an electromagnetic linear motor as a linear-acting actuator, which generates a thrust in the straight direction indicated by the arrow in FIG. 17 by the interaction between a stator 81a having a coil winding and a movable part 81b fixed to the inertial load 82 and having a permanent magnet. The linear-acting actuator 81 is fastened to a vibration suppression target through a base member 83 and generates a thrust to displace the inertial load 82 with respect to the vibration suppression target. When the linear-acting actuator 81 is caused to generate a thrust to displace the inertial load 82, the reaction force of the thrust acting on the inertial load 82 acts on the vibration suppression target.

FIG. 18 shows an example of the structure of a vibration suppression apparatus that acts to reduce vibrations in the horizontal direction by a similar method. Like the apparatus shown in FIG. 17, this apparatus is comprised of a linear-acting actuator 84 such as an electromagnetic linear motor, an inertial load 85 driven in the straight direction by the linear-acting actuator 84, and the like. FIG. 18 shows an example of the apparatus using an electromagnetic linear motor as a linear-acting actuator, which generates a thrust in the straight direction indicated by the arrow in FIG. 18 by the interaction between a stator 84a having a coil winding and a movable part 84b fixed to the inertial load 85 and having a permanent magnet. The linear-acting actuator 84 is fastened to a vibration suppression target through a base member 86 and generates a thrust to displace the inertial load 85 with respect to the vibration suppression target. When the linear-acting actuator 84 is caused to generate a thrust to displace the inertial load 85, the reaction force of a thrust acting on the inertial load 85 acts on the vibration suppression target.

An active vibration suppression apparatus of this type uses such a reaction force as a control force for a vibration suppression target, and adjusts the control force on the basis of a signal obtained by compensating for a detection signal representing the vibrations of the vibration suppression target, thereby performing vibration control. That is, unlike an active vibration isolation apparatus based on the vibration isolation leg scheme, this apparatus can reduce the vibrations of a vibration isolation base or equipment without applying any unnecessary force as the reaction force of a control force for vibration control to a portion outside the apparatus. This apparatus, therefore, has the merit of preventing the reaction force of a force for the reduction/suppression of vibrations from exciting vibrations in an apparatus mount pedestal or peripheral environment, which cause vibrations affecting precision equipment mounted on the vibration isolation base.

An apparatus of this type is configured to obtain a force acting on a vibration suppression target from a drive reaction force of an inertial load in a vibration suppression unit instead of being generated between external equipment and a vibration suppression target. If, therefore, the vibration suppression apparatus can be manufactured into an appropriate shape, a vibration suppressing effect can be obtained by locating the apparatus to a place where a dashpot used to reduce the structural resonance vibrations of equipment or a reinforcing member for ensuring rigidity cannot be installed.

In actually using an active vibration suppression apparatus of this type for applying a control force to a vibration suppression target by using a linear-acting actuator, an inertial load and its movable stroke must be appropriately designed in consideration of a control force necessary for the reduction of vibrations, the frequency band of vibrations to be suppressed, and the like.

Assume that the vibrations of a vibration suppression target which originate from the drive reaction force produced by equipment such as an X-Y stage are reduced by using an active vibration suppression apparatus of the type described above with reference to FIGS. 17 and 18. In this case, to obtain a control force required to suppress vibrations, an apparatus having an inertial load mass and a movable stroke equal to or similar to those of the X-Y stage must be used. However, since an allowable space is limited, a mass and movable stroke sufficient to obtain a predetermined vibration suppressing action and effect may not be ensured.

Assume that vibrations to be suppressed by an active vibration suppression apparatus of this type are the resonance vibrations of a structure having a relatively high resonance frequency, and a large mass or stroke are not required to suppress the vibrations of the structure itself. Even in this case, if equipment such as an X-Y stage operates on a surface plate, or the like, rigidly fastened to a vibration suppression target, a vibration isolation base on which the X-Y stage, and the like, are mounted vibrates at a low frequency corresponding to the natural frequency of a vibration system constituted by support legs of the vibration isolation base. As a consequence, the structure as the vibration suppression target also vibrates at the low frequency. In such a case, due to the influence of the low-frequency vibrations produced in the vibration isolation base and the structure as the vibration suppression target, the inertial load as a part of the active vibration suppression apparatus may greatly swing and operate beyond its movable stroke.

If the stroke of the inertial load is limited due to such restrictions on the specifications of the structure of the vibration suppression apparatus, the generation of vibrations of frequency components other than the control target, or the like, may prevent a sufficient vibration suppressing effect from being obtained. Furthermore, the inertial load may collide with a member such as a stopper, which is placed to prevent the inertial load from exceeding the stroke range. This may create a large shock to the vibration suppression control system, resulting in a control operation failure. In contrast to this, if the control gain is suppressed to prevent an inconvenience caused by stroke over, a necessary control effect cannot be ensured.

Under these circumstances, an active vibration isolation apparatus based on the vibration isolation leg scheme that has been widely used in a semiconductor exposure apparatus, and the like, is configured to apply a control force to a vibration isolation base or a member rigidly fastened to the base. That is, the apparatus is configured to reduce/suppress the vibrations of the vibration isolation base or surface plate on which various types of equipment constituting an exposure apparatus are mounted. In this case, if equipment and structures are rigidly fastened to the vibration isolation base or surface plate, and no structural resonance occurs, the vibrations of the mounted equipment and structures can be satisfactorily reduced/suppressed by the vibration isolation apparatus based on the vibration isolation leg scheme.

In many cases, in an actual apparatus, however, structural resonance vibrations are produced in mounted equipment and structures due to various restrictions on equipment design, and a satisfactory damping property cannot be provided for the resonance vibrations. In addition, when heavy equipment and structures are fastened to the vibration isolation base or surface plate, a spring/mass system may be formed due to insufficient fastening rigidity, and vibrations may be produced at a level that cannot be neglected in ensuring satisfactory apparatus performance.

When such vibrations are produced in a mounted equipment and structures, even if the vibrations of the vibration isolation base or surface plate are reduced/suppressed, those of these equipment and structures cannot be sufficiently suppressed. This affects the precision of the apparatus and degrades the exposure performance. In a semiconductor exposure apparatus, in particular, some structure needs to have a cantilever support structure in terms of equipment layout design, and swinging vibrations are produced around the fulcrum of the structure, affecting the performance of the semiconductor exposure apparatus.

The vibrations of mounted equipment/structure of this type can be reduced/suppressed by interposing a dashpot for providing a damping property between the external equipment and the vibration suppression target or by attaching a reinforcing member for ensuring rigidity. However, such a member cannot be attached because of restrictions on the equipment layout design in many cases. For this reason, vibrations such as structural resonance of equipment/structure cannot be sufficiently suppressed, and such vibrations often become big factors that hinder an improvement in the performance of a semiconductor exposure apparatus. Therefore, demands have arisen for a means/method of effectively reducing/suppressing (i) rigid-body vibrations and structural resonance of equipment/structures having severe restrictions on the layout design, and for a semiconductor exposure apparatus having the means/method.

In addition, with an increase in the precision of a semiconductor exposure apparatus, it is required to further reduce the influence of environmental vibrations of an apparatus mount pedestal, and the like. In order to meet such a requirement, a control method has been proposed and applied to the above active vibration isolation apparatus based on the vibration isolation leg scheme, which compensates for a detection signal representing the vibrations of an apparatus mount pedestal for these vibrations and feeding forward the resultant signal to an actuator for applying a control force to a vibration isolation base. According to this method, the actuator is made to generate a control force to cancel out vibrations transmitted from the apparatus mount pedestal to the vibration isolation base through vibration isolation legs on the basis of a detection signal representing the vibrations of the apparatus mount pedestal. This method can reduce/suppress the amount of vibrations transmitted from the apparatus mount pedestal much more than the control scheme using only a detection signal representing the vibrations of the vibration isolation base.

This control operation is, however, performed by using a detection signal representing the vibrations of a floor or apparatus mount pedestal, i.e., a detection signal representing a physical quantity including many uncertainties in terms of the generation mechanism of vibrations. For this reason, owing to various uncertainties acting in an apparatus mount environment, unpredictable, uncertain signals may be fed forward to the control system. That is, this control method has a weak point in the reliability of vibration control operation.

Such a problem can be effectively solved by a method of reducing vibrations transmitted to the exposure apparatus body by suppressing the vibrations of a structure itself on the apparatus pedestal on which the semiconductor exposure apparatus is installed. In consideration of such a point as well, demands have arisen for a means/method of reducing/suppressing vibrations of types that are not suited to a vibration isolation apparatus based on the vibration isolation leg scheme.

In the prior art associated with Japanese Patent Application No. 11-151141, and the like, there is no detailed description about a vibration suppression method and an apparatus aimed at removing the vibrations of a structure as a part of a semiconductor exposure apparatus, more specifically, the vibrations of a cantilever support structure as a part of a semiconductor exposure apparatus, a structure on the mount pedestal side on which vibration isolation legs for vibration-isolating/supporting a semiconductor exposure apparatus are mounted, and the like, as in the apparatus according to the present invention. In "Active Vibration Suppression Apparatus", Japanese Patent Application No. 2000-122731, and Japanese Patent Laid-Open No. 11-190786, a vibration suppression apparatus for a semiconductor exposure apparatus is described. Basically, however, such references are limited to the disclosure of vibration suppression methods and apparatuses aimed at suppressing rigid-body vibrations such as the vibrations of a vibration isolation base or surface plate as a part of an exposure apparatus body.

SUMMARY OF THE INVENTION

The present invention has been proposed to solve the conventional problems.

It is the first object of the present invention to provide an active vibration suppression apparatus and a control method therefor, which solve the above problems caused when severe restrictions are imposed on the movable stroke, mass, and the like, of an inertial load in an active vibration suppression apparatus using an actuator, can realize both a vibration suppressing effect and stable operation upon production of large vibrations, and can obtain maximum vibration suppression performance under the restrictions.

It is the second object of the present invention to provide an active vibration suppression apparatus which can stably and quickly suppress vibrations of the types that cannot be sufficiently reduced/suppressed by a conventional vibration isolation apparatus based on the vibration isolation leg scheme or vibrations of the types that are not suited to the application of the vibration isolation apparatus based on the vibration isolation leg scheme and has a structure in which the restrictions on the equipment layout design are not severe, and a high-performance exposure apparatus using the active vibration suppression apparatus.

More specifically, it is the third object of the present invention to effectively reduce/suppress vibrations of the types that fall outside the application range of conventional techniques, e.g., local vibrations such as structural resonance caused in a cantilever support structure as a part of an exposure apparatus or structural vibrations that are not produced in an exposure apparatus body, but are produced in a structure on the mount pedestal on which the apparatus is mounted, as well as rigid-body vibrations caused in a structure as a part of a main body structure such as a semiconductor exposure apparatus.

In order to achieve the above objects, according to the present invention, the following apparatuses, and the like, are described in detail below.

An active vibration suppression apparatus according to the present invention comprises: an actuator which is fixed to a vibration suppression target and generates a thrust; an inertial load which is connected to the actuator and is driven relative to the vibration suppression target in accordance with the thrust generated by the actuator; and a driving circuit for generating a driving command signal for controlling driving of the inertial load and driving the actuator in accordance with the driving command signal, wherein the actuator drives the inertial load with the generated thrust, and applies a drive reaction force generated upon driving of the inertial load as a control force to the vibration suppression target, thereby reducing vibrations produced in the vibration suppression target.

Preferably, in the above active vibration suppression apparatus, the actuator generates a thrust in a straight direction to drive the inertial load in the straight direction, and reduces vibrations of the vibration suppression target in the straight direction with a drive reaction force in the straight direction.

Note that a vibration suppression unit of the type that applies a control force to a vibration suppression target by driving an inertial load in the straight direction will be referred to as a linear-acting vibration suppression unit hereinafter.

Preferably, the above active vibration suppression apparatus further comprises: a vibration detection unit for detecting vibrations of the vibration suppression target; and a compensation computation section for performing compensation computation processing for a signal corresponding to the vibrations of the vibration suppression target which are detected by the vibration detection unit.

In this case, preferably, in the above active vibration suppression apparatus, the compensation computation section performs a nonlinear compensation computation for the signal corresponding to the vibrations of the vibration suppression target which are detected by the vibration detection unit.

Preferably, in the above active vibration suppression apparatus, the driving circuit generates a driving command signal for driving the actuator on the basis of a signal obtained by the compensation computation section, and the actuator generates a control force for reducing the vibrations of the vibration suppression target by driving the inertial load on the basis of the driving command signal.

Preferably, in the above active vibration suppression apparatus, the compensation computation section performs a linear compensation computation including at least one of proportional compensation, integral compensation, differential compensation, phase-lead compensation, and phase-lag compensation for a signal corresponding to the vibrations of the vibration suppression target which are detected by the vibration detection unit, and further performs a nonlinear compensation computation for a signal having undergone the linear compensation computation.

Preferably, in the above active vibration suppression apparatus, the nonlinear compensation computation is described by a nonlinear function which is a monotonously increasing or decreasing function and outputs a signal obtained by multiplying an input signal by a gain whose absolute value decreases as a value of the input signal separates from a neutral point of the input signal.

Preferably, in the above active vibration suppression apparatus, when equipment having driving means is mounted on the vibration suppression target, or the equipment having the driving means is fastened to the vibration suppression target with high rigidity, and the driving means of the equipment vibrates the vibration suppression target, the apparatus further comprises a feedforward compensation computation section for receiving one of a signal obtained by measuring operation of the equipment having the driving means and a control signal from a control section for the equipment and performing feedforward compensation computation processing for the signal, the driving circuit generates a driving command signal for driving the actuator on the basis of an output signal from the feedforward compensation computation section, and the actuator drives the inertial load on the basis of the driving command signal, thereby generating a control force for reducing the vibrations of the vibration suppression target.

In this case, preferably, in the above vibration suppression apparatus, the feedforward compensation computation section performs a nonlinear compensation computation for one of the signal obtained by measuring the operation state of the equipment having the driving means and the control signal from the control section for the equipment.

Preferably, in the above active vibration suppression apparatus, the feedforward compensation computation section performs a linear compensation including at least one of proportional compensation, integral compensation, differential compensation, phase-lead compensation, and phase-lag compensation for the signal obtained by measuring the operation state of the equipment having the driving means and the control signal from the control section for the equipment, and further performs a nonlinear compensation for a signal having undergone the linear compensation computation.

Preferably, in the above active vibration suppression apparatus, the nonlinear compensation computation is described by a nonlinear function which is a monotonously increasing or decreasing function and outputs a signal obtained by multiplying an input signal by a gain whose absolute value decreases as a value of the input signal separates from a neutral point of the input signal.

In addition, according to the present invention, there is provided a control method for an active vibration suppression apparatus comprising: the detection step of detecting a signal corresponding to vibrations of a vibration suppression target by using a vibration detection unit; the acquisition step of performing processing to acquire an operation signal obtained by measuring an operation state of equipment having driving means and/or a control signal from the equipment; the first computation step of performing a first nonlinear compensation computation for the signal detected in the detection step; the second computation step of performing a second nonlinear compensation computation for the signal acquired in the acquisition step; and the control step of driving an actuator and generating a control force for reducing the vibrations of the vibration suppression target on the basis of the signal having undergone the nonlinear compensation computation in the first and/or second computation step.

Furthermore, an active vibration suppression apparatus according to the present invention comprises: a rotating actuator which is fixed to a vibration suppression target and generates a torque in a rotational direction; an inertial load which is connected to the actuator and moves in the rotational direction relative to the vibration suppression target in accordance with a torque of the actuator; and a driving circuit for generating a driving command signal for controlling the inertial load and driving the rotating actuator in accordance with the driving command signal, wherein the rotating actuator rotates/drives the inertial load with a generated torque, and reduces vibrations produced in the vibration suppression target by applying a drive reaction force generated upon rotating/driving the inertial load as a control torque to the vibration suppression target.

Preferably, the above active vibration suppression apparatus further comprises: a rotational vibration detection unit for detecting vibrations of the vibration suppression target in a rotational motion direction; and a rotational vibration compensation computation section for performing compensation computation processing for a signal corresponding to the rotational vibrations of the vibration suppression target which are detected by the rotational vibration detection unit.

Preferably, in the above active vibration suppression apparatus, the driving circuit generates a driving command signal for driving the rotating actuator on the basis of the signal obtained by the rotational vibration compensation computation section, and the rotating actuator rotates/drives the inertial load on the basis of the driving command signal, thereby generating a control torque for reducing the vibrations of the vibration suppression target.

Preferably, in the above active vibration suppression apparatus, when equipment having driving means is mounted on the vibration suppression target, or the equipment having the driving means is fastened to the vibration suppression target with high rigidity, and the driving means of the equipment vibrates the vibration suppression target, the apparatus further comprises a second feedforward compensation computation section for receiving one of a signal obtained by measuring operation of the equipment having the driving means and a control signal from a control section for the equipment and performing feedforward compensation computation processing for the signal, the driving circuit generates a driving command signal for driving the actuator on the basis of an output signal from the second feedforward compensation computation section, and the actuator drives the inertial load on the basis of the driving command signal, thereby generating a control torque for reducing the vibrations of the vibration suppression target.

Preferably, the above active vibration suppression apparatus comprises rigidity providing means functioning to restore the inertial load to a predetermined neutral position.

According to the present invention, there is provided a control method for an active vibration suppression apparatus comprising: the detection step of detecting a signal corresponding to vibrations of a vibration suppression target in a rotational direction by using a vibration detection unit; the acquisition step of performing processing to acquire an operation signal obtained by measuring an operation state of equipment having driving means and/or a control signal from the equipment; the first computation step of performing a first nonlinear compensation computation for the signal detected in the detection step; the second computation step of performing a second nonlinear compensation computation for the signal acquired in the acquisition step; and the control step of driving an actuator and generating a control torque for reducing the vibrations of the vibration suppression target on the basis of the signal having undergone the nonlinear compensation computation in the first and/or second computation step.

An exposure apparatus according to the present invention comprises: a stage apparatus having a substrate or master plate as an exposure target mounted thereon and performing precision positioning operation; and an active vibration suppression apparatus which acts on a surface plate on which the stage apparatus is mounted or an exposure apparatus housing structure mounted on the surface plate to reduce vibrations in the surface plate or the exposure apparatus housing structure in a translation direction which are produced upon driving of the stage apparatus, the active vibration suppression apparatus including an actuator which is fixed to the surface plate or an exposure apparatus housing structure and generates a thrust, an inertial load which is connected to the actuator and is driven relative to the surface plate or exposure apparatus housing structure in accordance with the thrust generated by the actuator, and a driving circuit for generating a driving command signal for controlling driving of the inertial load and driving the actuator in accordance with the driving command signal, wherein the actuator drives the inertial load with the generated thrust, and applies a drive reaction force generated upon driving of the inertial load as a control force to the surface plate or exposure apparatus housing structure to reduce vibrations produced in the surface plate or the exposure apparatus housing structure.

An exposure apparatus according to the present invention comprises: a stage apparatus having a substrate or master plate as an exposure target mounted thereon and performing a precision positioning operation; and an active vibration suppression apparatus which acts on a surface plate on which the stage apparatus is mounted or an exposure apparatus housing structure mounted on the surface plate to reduce vibrations of the surface plate or exposure apparatus housing structure in a rotational direction which are produced upon driving of the stage apparatus, the active vibration suppression apparatus including a rotating actuator which is fixed to the surface plate or exposure apparatus housing structure and generates a torque in a rotational direction, an inertial load which is connected to the actuator and moves in the rotational direction relative to the surface plate or exposure apparatus housing structure in accordance with a torque of the actuator, and a driving circuit for generating a driving command signal for controlling the inertial load and driving the rotating actuator in accordance with the driving command signal, wherein the rotating actuator rotates/drives the inertial load with a generated torque, and reduces vibrations produced in the surface plate or the exposure apparatus housing structure by applying a drive reaction force generated upon rotating/driving the inertial load as a control torque to the surface plate or exposure apparatus housing structure.

An exposure apparatus according to the present invention comprises: a stage apparatus having a substrate or master plate as an exposure target mounted thereon and performing precision positioning operation; a first active vibration suppression apparatus which acts on a surface plate on which the stage apparatus is mounted or an exposure apparatus housing structure mounted on the surface plate to reduce vibrations of the surface plate or the exposure apparatus housing structure in a translation direction which are produced upon driving of the stage apparatus; and a second active vibration suppression apparatus for reducing rotational vibrations of the surface plate or the exposure apparatus housing structure, wherein vibrations produced upon driving of the stage apparatus are reduced by the first active vibration suppression apparatus and/or the second active vibration suppression apparatus.

Preferably, in the above exposure apparatus, the first active vibration suppression apparatus comprises: an actuator which is fixed to the surface plate or the exposure apparatus housing structure and generates a thrust, an inertial load which is connected to the actuator and is driven relative to the surface plate or the exposure apparatus housing structure in accordance with the thrust generated by the actuator, and a driving circuit for generating a driving command signal for controlling driving of the inertial load and driving the actuator in accordance with the driving command signal, wherein the actuator drives the inertial load with the generated thrust, and applies a drive reaction force generated upon driving of the inertial load as a control force to the surface plate or the exposure apparatus housing structure to reduce vibrations produced in the surface plate or the exposure apparatus housing structure.

Preferably, in the above exposure apparatus, the second active vibration suppression apparatus comprises: a rotating actuator which is fixed to the surface plate or the exposure apparatus housing structure and generates a torque in a rotational direction, an inertial load which is connected to the actuator and moves in the rotational direction relative to the surface plate or the exposure apparatus housing structure in accordance with a torque of the actuator, and a driving circuit for generating a driving command signal for controlling the inertial load and driving the rotating actuator in accordance with the driving command signal, wherein the rotating actuator rotates/drives the inertial load with a generated torque, and reduces vibrations produced in the surface plate or the exposure apparatus housing structure by applying a drive reaction force generated upon rotating/driving the inertial load as a control torque to the surface plate or the exposure apparatus housing structure.

An exposure apparatus according to the present invention comprises an active vibration suppression apparatus which is mounted on a structural member of a cantilever support structure forming a housing structure of the exposure apparatus and generates a drive reaction force for reducing/suppressing structural vibrations produced around a cantilever support portion of the structural member, wherein the active vibration suppression apparatus comprises: an actuator which is fixed to the structural member of the cantilever support structure and generates a thrust; an inertial load which is connected to the actuator and is driven relative to the structural member of the cantilever support structure in accordance with the thrust generated by the actuator; and a driving circuit for generating a driving command signal for controlling driving of the inertial load and driving the actuator in accordance with the driving command signal, and wherein the actuator drives the inertial load with the generated thrust, and applies a drive reaction force generated upon driving of the inertial load as a control force to the structural member of the cantilever support structure to reduce vibrations produced in the structural member of the cantilever support structure.

An exposure apparatus according to the present invention comprises an active vibration suppression apparatus for reducing/suppressing rotational vibrations around a rotation center of a support portion of a cantilever support structure forming a housing structure of the exposure apparatus with respect to a structural member of the cantilever support structure by acting in a tangential direction with respect to a direction of the rotational vibrations at a position as distant as possible from the support portion, wherein the active vibration suppression apparatus comprises: an actuator which is fixed to the structural member of the cantilever support structure and generates a thrust; an inertial load which is connected to the actuator and is driven relative to the structural member of the cantilever support structure in accordance with the thrust generated by the actuator; and a driving circuit for generating a driving command signal for controlling the inertial load and driving the actuator in accordance with the driving command signal, wherein the actuator drives the inertial load with a generated thrust, and reduces vibrations produced in the structural member of the cantilever support structure by applying a drive reaction force generated upon driving the inertial load as a control thrust to the structural member of the cantilever support structure.

Preferably, an exposure apparatus comprises an active vibration suppression apparatus for reducing/suppressing rotational vibrations around a rotation center of a support portion of a cantilever support structure forming a housing structure of the exposure apparatus with respect to a structural member of the cantilever support structure by generating a control torque in a direction of the rotational vibrations with the support portion being a rotation center, wherein the active vibration suppression apparatus includes: an actuator which is fixed to the structural member of the cantilever support structure and generates a thrust in a rotational direction; an inertial load which is connected to the actuator and is driven relative to the structural member of the cantilever support structure in accordance with the thrust generated by the actuator; and a driving circuit for generating a driving command signal for controlling the inertial load and driving the actuator in accordance with the driving command signal, and wherein the actuator drives the inertial load with a generated thrust, and reduces vibrations produced in the structural member of the cantilever support structure by applying a drive reaction force generated upon driving the inertial load as a control thrust to the structural member of the cantilever support structure.

Preferably, in the above exposure apparatus, the cantilever support structure is a mechanical structure forming an illumination optical unit for emitting exposure light for exposing a photosensitive substrate to a circuit pattern formed on a master plate through an optical lens.

An exposure apparatus according to the present invention comprises an active vibration suppression apparatus which is installed on an apparatus mount pedestal side structure on which the exposure apparatus is installed and actively reduces vibrations transmitted from the apparatus mount pedestal side structure to the exposure apparatus, wherein the active vibration suppression apparatus includes: an actuator which is fixed to an apparatus mount pedestal side structure and generates a thrust; an inertial load which is connected to the actuator and is driven relative to the apparatus mount pedestal side structure in accordance with the thrust generated by the actuator; and a driving circuit for generating a driving command signal for controlling driving of the inertial load and driving the actuator in accordance with the driving command signal, and wherein the actuator drives the inertial load with the generated thrust, and applies a drive reaction force generated upon driving of the inertial load as a control force to the apparatus mount pedestal side structure, thereby reducing vibrations produced in the apparatus mount pedestal side structure.

A semiconductor device manufacturing method according to the present invention comprises: the step of installing a plurality of semiconductor manufacturing apparatuses including an exposure apparatus in a semiconductor manufacturing factory; and the step of manufacturing a semiconductor device by using the plurality of semiconductor manufacturing apparatuses, the exposure apparatus including a stage apparatus having a substrate or master plate as an exposure target mounted thereon and performing precision positioning operation, and an active vibration suppression apparatus which acts on a surface plate on which the stage apparatus is mounted or an exposure apparatus housing structure mounted on the surface plate to reduce vibrations of the surface plate or the exposure apparatus housing structure in a translation direction which are produced upon driving of the stage apparatus, the active vibration suppression apparatus including an actuator which is fixed to the surface plate or the exposure apparatus housing structure and generates a thrust, an inertial load which is connected to the actuator and is driven relative to the surface plate or the exposure apparatus housing structure in accordance with the thrust generated by the actuator, and a driving circuit for generating a driving command signal for controlling driving of the inertial load and driving the actuator in accordance with the driving command signal, wherein the actuator drives the inertial load with the generated thrust, and applies a drive reaction force generated upon driving of the inertial load as a control force to the surface plate or the exposure apparatus housing structure to reduce vibrations produced in the surface plate or the exposure apparatus housing structure.

A semiconductor device manufacturing method according to the present invention comprises: the step of installing a plurality of semiconductor manufacturing apparatuses including an exposure apparatus in a semiconductor manufacturing factory; and the step of manufacturing a semiconductor device by using the plurality of semiconductor manufacturing apparatuses, the exposure apparatus including a stage apparatus having a substrate or master plate as an exposure target mounted thereon and performing precision positioning operation, and an active vibration suppression apparatus which acts on a surface plate on which the stage apparatus is mounted or an exposure apparatus housing structure mounted on the surface plate to reduce vibrations of the surface plate or the exposure apparatus housing structure in a rotational direction which are produced upon driving of the stage apparatus, the active vibration suppression apparatus including a rotating actuator which is fixed to the surface plate or the exposure apparatus housing structure and generates a torque in a rotational direction, an inertial load which is connected to the actuator and moves in the rotational direction relative to the surface plate or the exposure apparatus housing structure in accordance with a torque of the actuator, and a driving circuit for generating a driving command signal for controlling the inertial load and driving the rotating actuator in accordance with the driving command signal, wherein the rotating actuator rotates/drives the inertial load with a generated torque, and reduces vibrations produced in the surface plate or the exposure apparatus housing structure by applying a drive reaction force generated upon rotating/driving the inertial load as a control torque to the surface plate or the exposure apparatus housing structure.

Preferably, the above semiconductor device manufacturing method further comprises: the step of connecting the plurality of semiconductor manufacturing apparatuses via a local area network; the step of connecting the local area network to an external network outside the semiconductor manufacturing factory; the step of acquiring information associated with the exposure apparatus from a database on the external network by using the local area network and the external network; and the step of controlling the exposure apparatus on the basis of the acquired information.

Preferably, the above semiconductor device manufacturing method further comprises the step of accessing a database provided by a vendor or user of the exposure apparatus via the external network to obtain maintenance information of the manufacturing apparatus by data communication, or performing production management by data communication between the semiconductor manufacturing factory and another semiconductor manufacturing factory via the external network.

A semiconductor manufacturing factory according to the present invention comprises: a plurality of semiconductor manufacturing apparatuses, including an exposure apparatus; a local area network for connecting the manufacturing apparatuses; and a gateway which connects the local area network to an external network of the semiconductor manufacturing factory and allows communication of information associated with at least one of the plurality of semiconductor manufacturing apparatuses, the exposure apparatus including a stage apparatus having a substrate or master plate as an exposure target mounted thereon and performing precision positioning operation, and an active vibration suppression apparatus which acts on a surface plate on which the stage apparatus is mounted or on an exposure apparatus housing structure mounted on the surface plate to reduce vibrations of the surface plate or the exposure apparatus housing structure in a translation direction, which are produced upon driving of the stage apparatus, the active vibration suppression apparatus including an actuator which is fixed to the surface plate or the exposure apparatus housing structure and generates a thrust, an inertial load which is connected to the actuator and is driven relative to the surface plate or the exposure apparatus housing structure in accordance with the thrust generated by the actuator, and a driving circuit for generating a driving command signal for controlling driving of the inertial load and driving the actuator in accordance with the driving command signal, wherein the actuator drives the inertial load with the generated thrust, and applies a drive reaction force generated upon driving of the inertial load as a control force to the surface plate or the exposure apparatus housing structure to reduce vibrations produced in the surface plate or the exposure apparatus housing structure.

A semiconductor manufacturing factory according to the present invention comprises: a plurality of semiconductor manufacturing apparatuses, including an exposure apparatus; a local area network for connecting the manufacturing apparatuses; and a gateway which connects the local area network to an external network of the semiconductor manufacturing factory and allows communication of information associated with at least one of the plurality of semiconductor manufacturing apparatuses, the exposure apparatus including a stage apparatus having a substrate or master plate as an exposure target mounted thereon and performing precision positioning operation; and an active vibration suppression apparatus which acts on a surface plate on which the stage apparatus is mounted or an exposure apparatus housing structure mounted on the surface plate to reduce vibrations of the surface plate or the exposure apparatus housing structure in a rotational direction which are produced upon driving of the stage apparatus, the active vibration suppression apparatus including a rotating actuator which is fixed to the surface plate or the exposure apparatus housing structure and generates a torque in a rotational direction, an inertial load which is connected to the actuator and moves in the rotational direction relative to the surface plate or the exposure apparatus housing structure in accordance with a torque of the actuator, and a driving circuit for generating a driving command signal for controlling the inertial load and driving the rotating actuator in accordance with the driving command signal, wherein the rotating actuator rotates/drives the inertial load with a generated torque, and reduces vibrations produced in the surface plate or the exposure apparatus housing structure by applying a drive reaction force generated upon rotating/driving the inertial load as a control torque to the surface plate or the exposure apparatus housing structure.

According to the present invention, there is provided a maintenance method for an exposure apparatus, the maintenance method comprising: the step of causing a vendor or user of the exposure apparatus to provide a maintenance database connected to an external network of the semiconductor manufacturing factory; the step of allowing access from the semiconductor manufacturing factory to the maintenance database via the external network; and the step of transmitting maintenance information accumulated in the maintenance database to the semiconductor manufacturing factory via the external network, and maintaining the exposure apparatus on the basis of the maintenance information, wherein the exposure apparatus includes a stage apparatus having a substrate or master plate as an exposure target mounted thereon and performing precision positioning operation, and an active vibration suppression apparatus which acts on a surface plate on which the stage apparatus is mounted or on an exposure apparatus housing structure mounted on the surface plate to reduce vibrations of the surface plate or the exposure apparatus housing structure in a translation direction, which are produced upon driving of the stage apparatus, the active vibration suppression apparatus includes an actuator which is fixed to the surface plate or the exposure apparatus housing structure and generates a thrust, an inertial load which is connected to the actuator and is driven relative to the surface plate or the exposure apparatus housing structure in accordance with the thrust generated by the actuator, and a driving circuit for generating a driving command signal for controlling driving of the inertial load and driving the actuator in accordance with the driving command signal, and wherein the actuator drives the inertial load with the generated thrust, and applies a drive reaction force generated upon driving of the inertial load as a control force to the surface plate or the exposure apparatus housing structure to reduce vibrations produced in the surface plate or the exposure apparatus housing structure.

According to the present invention, there is provided a maintenance method for an exposure apparatus, the maintenance method comprising: the step of causing a vendor or user of the exposure apparatus to provide a maintenance database connected to an external network of the semiconductor manufacturing factory; the step of allowing access from the semiconductor manufacturing factory to the maintenance database via the external network; and the step of transmitting maintenance information accumulated in the maintenance database to the semiconductor manufacturing factory via the external network, and maintaining the exposure apparatus on the basis of the maintenance information, wherein the exposure apparatus includes a stage apparatus having a substrate or master plate as an exposure target mounted thereon and performing precision positioning operation, and an active vibration suppression apparatus which acts on a surface plate on which the stage apparatus is mounted or an exposure apparatus housing structure mounted on the surface plate to reduce vibrations of the surface plate or the exposure apparatus housing structure in a rotational direction which are produced upon driving of the stage apparatus, the active vibration suppression apparatus including a rotating actuator which is fixed to the surface plate or the exposure apparatus housing structure and generates a torque in a rotational direction, an inertial load which is connected to the actuator and moves in the rotational direction relative to the surface plate or the exposure apparatus housing structure in accordance with a torque of the actuator, and a driving circuit for generating a driving command signal for controlling the inertial load and driving the rotating actuator in accordance with the driving command signal, and wherein the rotating actuator rotates/drives the inertial load with a generated torque, and reduces vibrations produced in the surface plate or the exposure apparatus housing structure by applying a drive reaction force generated upon rotating/driving the inertial load as a control torque to the surface plate or the exposure apparatus housing structure.

Preferably, the above exposure apparatus further comprises a display for displaying maintenance information, a network interface which is connected to a computer network to communicate the maintenance information, and a computer for executing the communication by using network software, and can perform data communication of maintenance information of the exposure apparatus via the computer network.

Preferably, in the above exposure apparatus, the network software provides, on the display, a user interface which is connected to the external network of the factory in which the exposure apparatus is installed and used to access the maintenance database provided by the vendor or user of the exposure apparatus, and allows acquisition of information from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 21 is a view showing a specific example of a user interface;

DETAILED DESCRIPTION OF THE PREFERRED EMBODIMENTS

Preferred embodiments of the present invention will now be described in detail in accordance with the accompanying drawings.

First Embodiment

In the first embodiment of the present invention, an active vibration suppression apparatus will be described below, which reduces vibrations that are produced in a precision equipment mount vibration isolation base or in an object mounted on a vibration isolation base, and affect precision equipment, such as a semiconductor exposure apparatus.

Figure 1:
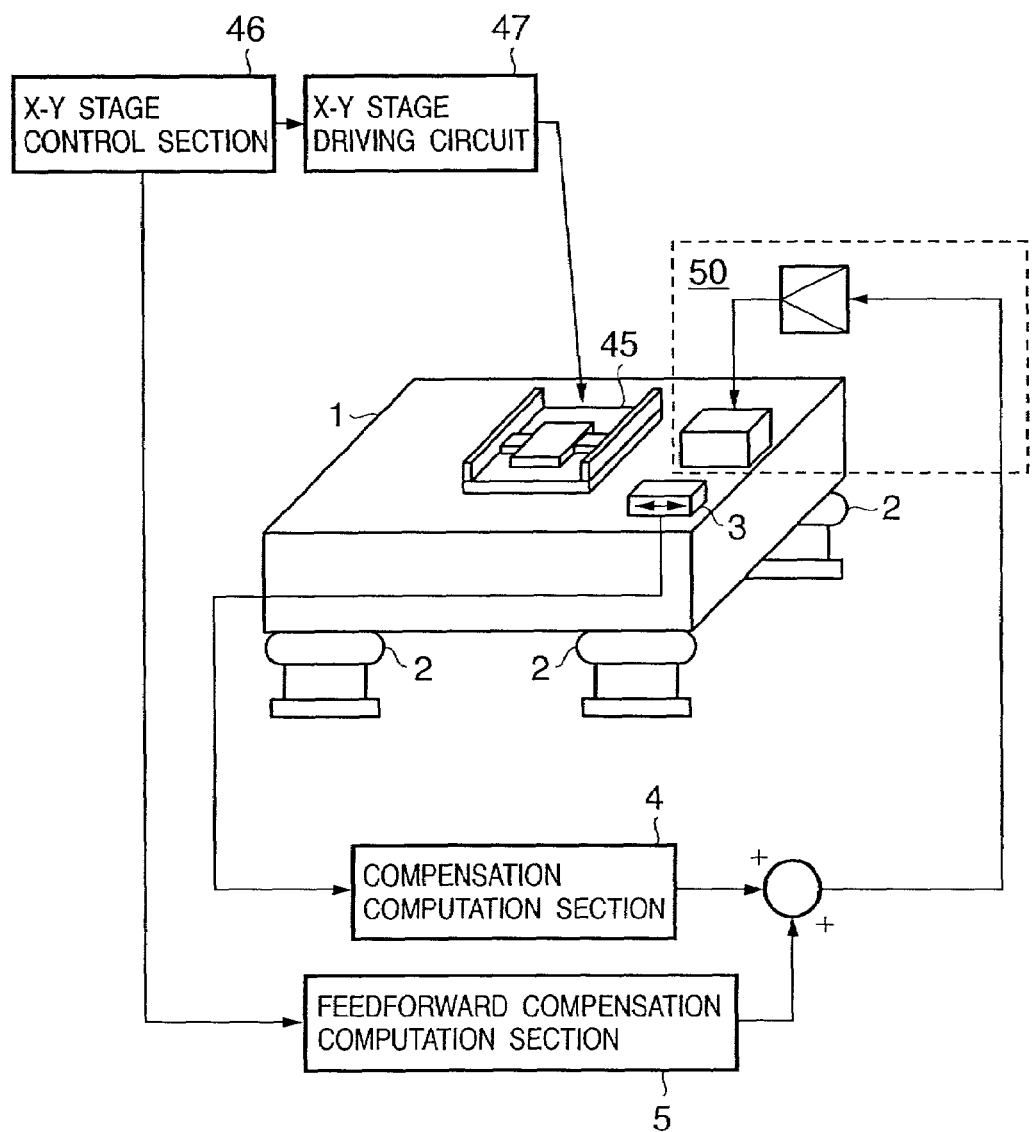
FIG. 1 is a view showing the arrangement of an active vibration suppression apparatus according to the first embodiment of the present invention.

FIG. 1 is a view showing the arrangement of an active vibration isolation apparatus according to the first embodiment of the present invention. In the active vibration suppression apparatus according to this embodiment, a vibration suppression target is a vibration isolation base 1 supported to be vibration-isolated by support mechanisms 2 such as air springs. In a semiconductor exposure apparatus, an exposure apparatus body supported by a vibration isolation apparatus or a vibration isolation base on which a stage apparatus having a substrate (silicon wafer, or the like) or master plate (reticle, or the like) mounted thereon, and which performs precision positioning operation, is a vibration suppression target equivalent to that in this embodiment. The embodiment will be described below with reference to FIG. 1.

The active vibration suppression apparatus according to this embodiment includes a linear-acting vibration suppression unit 50 for applying a control force to the vibration isolation base 1 as a vibration suppression target, a vibration detection unit 3 for detecting the vibrations of the vibration isolation base 1 as the vibration suppression target, a compensation computation section 4 for performing an appropriate compensation computation for a signal corresponding to the vibrations of the vibration suppression target, a feedforward compensation computation section 5 for performing a compensation computation for the operation state of equipment, such as an X-Y stage mounted on the vibration isolation base 1, or a signal from a control section for the equipment, and the like. For each support mechanism 2, a vibration isolation support mechanism using an elastic member, such as an air spring or rubber, can be used. In addition, for each support mechanism 2, an active vibration isolation apparatus can also be used, which detects the vibrations of the vibration isolation base 1 with a sensor, and performs control to reduce the vibrations by using an actuator for applying a control force to the vibration isolation base 1 on the basis of the signal obtained by compensating for the resultant signal.

Figure 2:
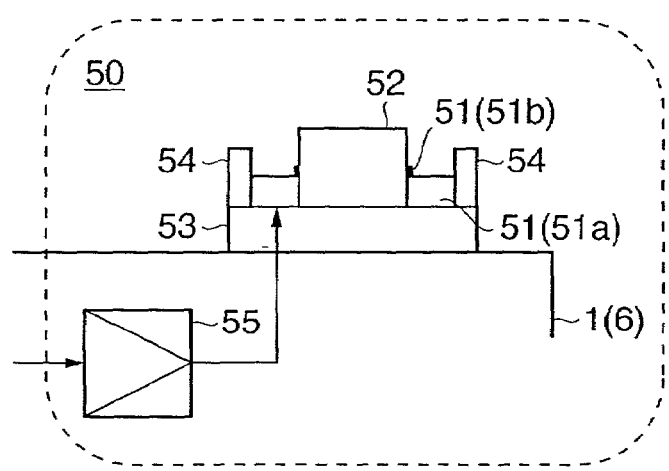
FIG. 2 is a view showing the arrangement of a linear-acting vibration suppression unit in FIG. 1.

As shown in FIG. 2, the linear-acting vibration suppression unit 50 is fixed on the vibration isolation base 1 as the vibration suppression target and is comprised of a linear-acting actuator 51 for generating a thrust in accordance with a driving signal, an inertial load 52 that is connected to the linear-acting actuator 51 and moves in a straight direction relative to the vibration isolation base 1, a base member 53, a stopper 54 for restricting the operation of the inertial load 52 within a predetermined range, a driving circuit 55 for the linear-acting actuator 51, and the like. The driving circuit 55 may not be mounted on the vibration isolation base 1 and may be kept apart from the linear-acting actuator 51, inertial load 52, and the like.

Figure 3:
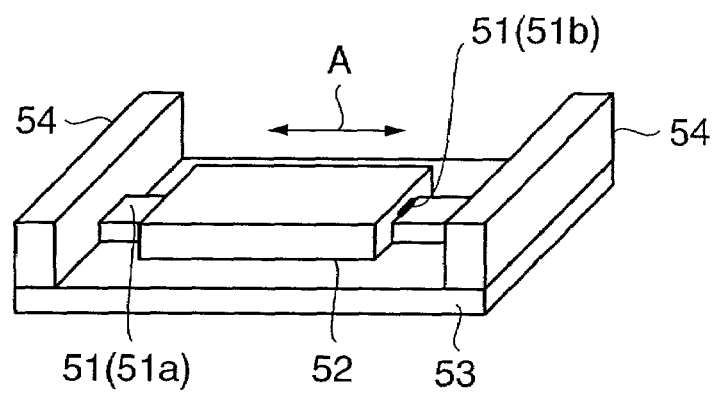
FIG. 3 is a perspective view showing a linear-acting actuator and an inertial load in FIG. 1.

FIG. 3 is a perspective view showing the linear-acting actuator 51, inertial load 52, and the like. The inertial load 52 is supported by a linear guide, whose detailed arrangement is omitted in FIG. 3, and the like, such that it can move in the direction indicated by an arrow A in FIG. 3. The inertial load 52 is driven in the straight direction indicated by the arrow A by the thrust generated by the linear-acting actuator 51. The linear-acting actuator 51 is comprised of a stator 51a and movable part 51b. The stator 51a is rigidly fastened to the vibration isolation base 1, whereas the movable part 51b is connected to the inertial load 52 and configured to be movable in a straight direction relative to the vibration isolation base 1.

As the linear-acting actuator 51 shown in FIG. 3, for example, an electromagnetic linear motor can be suitably used, which has a coil winding and permanent magnet mounted on the stator 51a and movable part 51b, respectively, and generates a thrust in the direction indicated by the arrow A in FIG. 3 using the interaction between a current flowing in the coil winding and the magnetic field generated by the permanent magnet. The thrust generated by such an electromagnetic linear motor can be easily controlled by controlling the current flowing in the coil winding by using the driving circuit 55.

Obviously, as the linear-acting actuator 51, other various types of actuators can be used, e.g., an actuator constituted by a rotating electromagnetic actuator such as a DC servo motor and a feed screw mechanism for converting the torque produced by the actuator into a thrust in a straight direction and moving the inertial load 52 in the straight direction.

This linear-acting actuator 51 is fixed to the vibration isolation base 1 as the vibration suppression target through the base member 53, and generates a thrust to displace the inertial load 52 relative to the vibration isolation base 1 as the vibration suppression target. When a thrust is generated in the linear-acting actuator 51 to displace the inertial load 52, a reaction force of the thrust acting on the inertial load 52 acts on the vibration suppression target. The vibration suppression apparatus according to this embodiment uses this reaction force as a control force for vibration control. That is, this vibration suppression apparatus adjusts the driving force generated by the linear-acting actuator 51 to drive the inertial load 52 so as to control a thrust applied as a reaction force to the vibration suppression target.

As the vibration detection unit 3 for detecting the vibrations of the vibration suppression target, i.e., the vibration isolation base 1, an acceleration sensor, velocity sensor, or the like, can be used.

The operation of the vibration suppression apparatus according to this embodiment will be described next with reference to FIG. 1.

The apparatus according to this embodiment performs the control operation of feeding back, to the linear-acting vibration suppression unit 50, the signal obtained by compensating for a signal corresponding to the vibrations of the vibration isolation base 1 as the vibration suppression target obtained by using the vibration detection unit 3 and compensation computation section 4, the control operation of feeding forward, to the linear-acting vibration suppression unit 50, the operation state of equipment such as an X-Y stage 45 mounted on the vibration isolation base 1 or information from a control section for the equipment by using the feedforward compensation computation section 5, and the like.

Feedback control operation using the vibration detection unit 3, compensation computation section 4, and the like, will be described first.

In the feedback control operation, the vibration detection unit 3 mounted on the vibration isolation base 1 is used to detect vibrations produced in the vibration isolation base 1 by vibration transmission from the apparatus mount pedestal or the operation of equipment such as the X-Y stage 45 mounted on the vibration isolation base 1, and the compensation computation section 4 performs an appropriate compensation computation for the resultant detection signal. The linear-acting vibration suppression unit 50 is then driven on the basis of the resultant signal to reduce/suppress the vibrations of the vibration isolation base 1.

In the apparatus according to this embodiment, the compensation computation section 4 executes a compensation computation by a nonlinear computation. Obviously, as this nonlinear computation, various types of computations can be used in accordance with applications and purposes. Consider a case wherein a linear compensation computation typified by proportional compensation or integral compensation is performed for a signal corresponding to the vibrations of the vibration suppression target, i.e., the vibration isolation base 1, which are detected by the vibration detection unit 3, and then a nonlinear compensation computation is performed for the resultant signal.

As a case of a linear compensation computation to be performed by the compensation computation section 4 to reduce the vibrations of the vibration isolation base 1, a case wherein a damping property is provided to the natural vibrations of the vibration system constituted by the vibration isolation base 1 and the support mechanism 2 that vibration-isolates/supports the vibration isolation base 1 will be described below. To provide a damping property to the natural vibrations of the vibration system constituted by the vibration isolation base 1 and support mechanism 2, a computation may be performed to apply a control force proportional to the vibration velocity of the vibration isolation base 1 to the vibration isolation base 1. When an acceleration sensor is used as the vibration detection unit 3 and an electromagnetic motor with a high response property is used as the linear-acting actuator 51 of the linear-acting vibration suppression unit 50, the compensation computation section 4 may mainly perform an integral compensation computation as a compensation computation for a signal corresponding to the vibration acceleration of the vibration isolation base 1, which is detected by the vibration detection unit 3. The electromagnetic motor generally exhibits an excellent response property up to a sufficiently high frequency as compared with the natural frequency of the vibration system constituted by the vibration isolation base 1 and support mechanism 2. For this reason, in a frequency region near the natural frequency, which requires a damping property, the electromagnetic motor receives a driving current command and can instantaneously generate a thrust almost equal to the thrust designated by the signal. The compensation computation section 4 may perform integral computation for the acceleration signal of the vibration isolation base 1, detected by the vibration detection unit 3, to obtain a signal proportional to the velocity. Obviously, according to the same concept as described above, when a velocity sensor is used as the vibration detection unit 3, the compensation computation section 4 may perform a proportional compensation computation.

In this case, the compensation computation section 4 performs a linear compensation computation to provide a damping property to the natural vibrations of the vibration system constituted by the vibration isolation base 1 and support mechanism 2. However, signals associated with acceleration, velocity, and vibration may be properly combined or linear compensation computations other than an integral compensation computation and proportional compensation computation, e.g., a differential compensation computation, a phase-lead compensation computation, and a phase-lag compensation computation, may be applied or used together to control the vibrations of the vibration isolation base 1 to an appropriate state.

Figure 4:
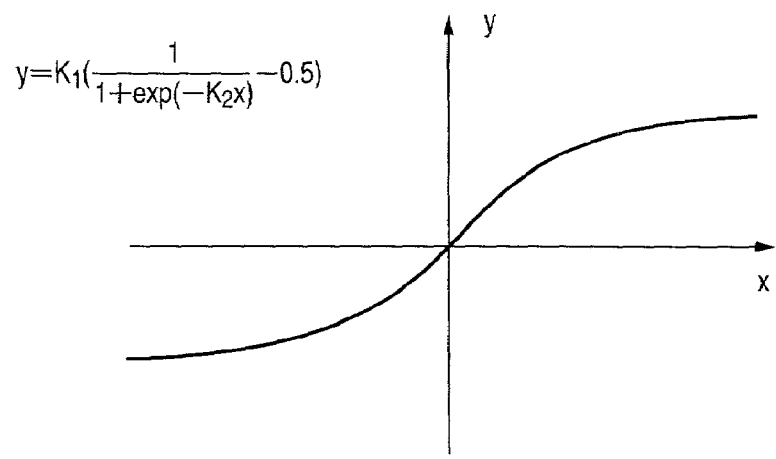
FIG. 4 is a graph showing an example of a nonlinear function applied to the active vibration suppression apparatus according to the first embodiment of the present invention.

In the active vibration suppression apparatus according to this embodiment, a nonlinear computation is further performed for the linear compensation computation result obtained in this manner. In this case, a nonlinear computation with an input/output characteristic like that shown in FIG. 4 is performed for the above linear compensation computation result, and the linear-acting vibration suppression unit 50 is controlled by using the computation result. The nonlinear computation shown in FIG. 4 is a monotonously increasing nonlinear function, an example of the function for outputting the signal obtained by multiplying an input signal by a gain which decreases with an increase in distance from the neutral point of the input signal. Letting x be the input and y be the output, this computation is represented by $$y = K_1 \left( \frac{1}{1 + \exp(-K_2 x)} - 0.5 \right) \quad (1)$$

where $K_1$ and $K_2$ are constants, and $K_2$ is a positive constant.

Letting x be the input and y be the output, this equation uses a nonlinear function called a sigmoid function expressed by $$y = \frac{1}{1 + \exp(-x)} \quad (2)$$

Note that the input/output characteristic shown in FIG. 4 can be described by a nonlinear function which monotonously increases with the positive constant $K_1$. Obviously, in some cases, a nonlinear computation described by a nonlinear function, which monotonously decreases with a negative constant $K_1$, can be used.

According to the function represented by equation (1), as the absolute value of the input x increases, the absolute value of the output y/input x ratio decreases. If, for example, $K_1=1$ and $K_2=1$, y/x=0.23 for x=1, but y/x=0.19 for x=2. That is, this function has an input/output characteristic in which as the input increases, the absolute value of the gain of output y/input x decreases.

Figure 7:
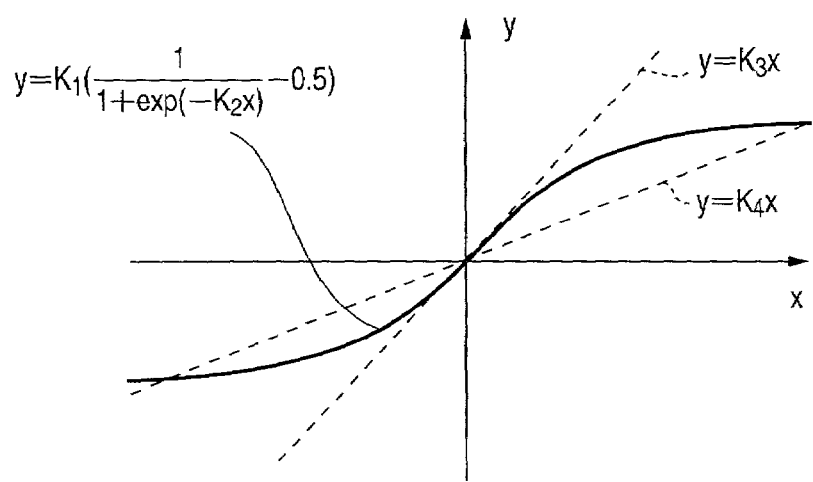
FIG. 7 is a graph showing the relationship between a nonlinear function and a linear function applied to the active vibration suppression apparatus according to the first embodiment of the present invention.

Assume that such a nonlinear computation is used. In this case, if the signal obtained by the above linear compensation computation, i.e., the input to a nonlinear computation, is small, an output signal equivalent to $y=K_3x$, as shown in FIG. 7, is generated. If, however, the signal obtained by the linear compensation computation is large, an output signal similar to linear function $y=K_4x$, proportional to a gain $K_4$ smaller in absolute value than $K_3$, is generated. That is, if the level of an input signal to the compensation computation section is high, a signal equivalent to that obtained upon suppression of a control gain is output as compared with a case wherein the level is low.

The apparatus according to this embodiment can therefore obtain a compensation computation result that ensures a high control gain in a sufficiently wide range with respect to the stroke range in which the operation of the inertial load 52 is restricted by the stopper 54 and decreases the control gain to prevent the inertial load 52 from exceeding the stroke range (stroke over) in a range in which a large control force is required.

Figure 5:
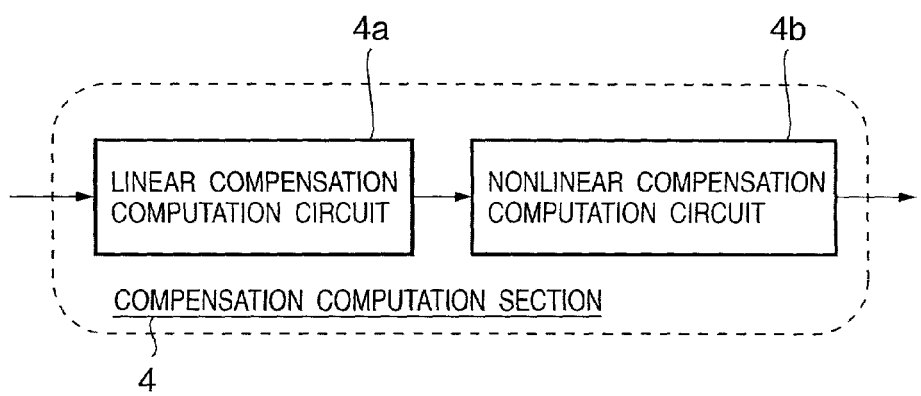
FIG. 5 is a block diagram showing an example of the arrangement of a compensation computation section applied to the active vibration suppression apparatus according to the first embodiment of the present invention.

FIG. 5 is a computation block diagram of the compensation computation section 4 described above. The compensation computation section 4 is formed by a series circuit of a linear compensation computation circuit 4*a* for performing an integral compensation computation, or the like, and a nonlinear compensation computation circuit 4*b* for performing a nonlinear compensation computation like equation (1).

Feedback control operation of the active vibration suppression apparatus according to this embodiment can be implemented by controlling the linear-acting vibration suppression unit 50 on the basis of the signal obtained by the compensation computation section 4 for performing compensation computations, including a nonlinear computation. Note that the nonlinear computation performed by the compensation computation section 4 is not limited to equation (1). Obviously, the compensation computation section 4 may be formed by only the nonlinear compensation computation circuit 4*b* instead of being constituted by the linear compensation computation circuit 4*a* and nonlinear compensation computation circuit 4*b*, as in this case.

Feedforward control operation using the feedforward compensation computation section 5 will be described next. The feedforward compensation computation section 5 serves to generate a signal for appropriate vibration control by performing compensation computation for a signal representing the operation state of equipment such as the X-Y stage mounted on the vibration isolation base 1. Feedforward control operation will be described in detail below.

Assume that an equipment having a driving means such as the X-Y stage 45 is mounted on the vibration isolation base 1, as shown in FIG. 1. This X-Y stage 45 is driven by an electromagnetic linear motor, or the like. The electromagnetic linear motor for driving the X-Y stage 45 is driven through an X-Y stage driving circuit 47 on the basis of a signal from an X-Y stage control section 46.

The feedforward compensation computation section 5 performs appropriate computation processing to make the linear-acting vibration suppression unit 50 effectively reduce/suppress vibrations produced in the vibration isolation base 1 by the drive reaction force of the X-Y stage 45 on the basis of a signal from the X-Y stage control section 46 or a signal associated with the driven state of the X-Y stage 45.

This feedforward compensation computation can be implemented by making the feedforward compensation computation section 5 perform an appropriate compensation computation by using a bandpass filter, or the like, on the basis of a signal proportional to the drive acceleration of the X-Y stage 45 or its drive reaction force, so as to apply a control force proportional to the signal in a desired control band. If the inertial load 52 exceeds the stroke range limited by the stopper 54 in realizing this feedforward control operation, a nonlinear compensation computation like the one represented by equation (1) is performed for such a linear compensation computation result, and the linear-acting vibration suppression unit 50 is controlled on the basis of the resultant signal. Basically, therefore, control is performed by driving the linear-acting vibration suppression unit 50 on the basis of a signal proportional to the drive acceleration of the X-Y stage 45 or its drive reaction force. Assume that when this signal is directly used, the inertial load 52 exceeds the stroke range, and the operation of the control system is impaired. In this case, to ensure stability, proper control operation, a nonlinear computation like equation (1) is performed for this signal, and the linear-acting vibration suppression unit 50 is driven by using the resultant signal. With this operation, the vibration suppression apparatus according to this embodiment can obtain a compensation computation result that ensures a high control gain in a sufficiently wide range with respect to the allowable stroke range in which the operation of the inertial load 52 is limited by the stopper 54, and decreases the control gain to prevent the inertial load 52 from exceeding the stroke range in a range in which a large control force is required.

Figure 6:
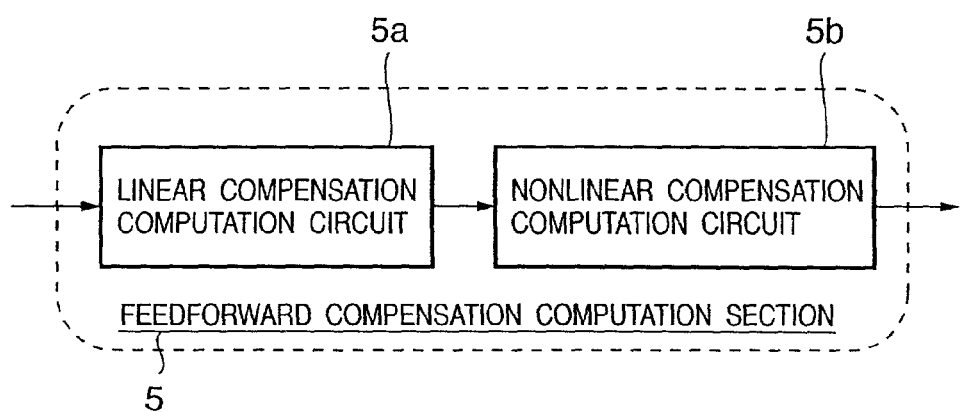
FIG. 6 is a block diagram showing an example of the arrangement of a feedforward compensation computation section applied to the active vibration suppression apparatus according to the first embodiment of the present invention.

FIG. 6 is a computation block diagram of the feedforward compensation computation section 5 described above, which includes a nonlinear compensation computation. The feedforward compensation computation section 5 is formed by a series circuit of a linear compensation computation circuit 5*a* for performing a proportional compensation computation, or the like, and a nonlinear compensation computation circuit 5*b* for performing a nonlinear computation like equation (1).

The feedforward control operation of the active vibration suppression apparatus according to this embodiment is implemented by controlling the linear-acting vibration suppression unit 50 on the basis of the signal obtained by the feedforward compensation computation section 5, including such a nonlinear computation. Note that the nonlinear computation performed by the feedforward compensation computation section 5 is not limited to equation (1). Obviously, the feedforward compensation computation section 5 may be formed by only the nonlinear compensation computation circuit 5b instead of being constituted by the linear compensation computation circuit 5a and nonlinear compensation computation circuit 5b, as in this case.

As described above, the apparatus according to this embodiment can perform compensation computations by computation processing including nonlinear computations in both the control operation of detecting the vibrations of the vibration isolation base 1 as the vibration suppression target, compensating for the resultant detection signal, and feeding back the resultant signal to the linear-acting vibration suppression unit 50 and the control operation of feeding forward information, such as the operation state of equipment mounted on the vibration isolation base 1, by using the feedforward compensation computation section 5. Although feedback control operation and feedforward control operation have been separately described, both feedback control operation and feedforward control operation can be simultaneously performed by driving the linear-acting vibration suppression unit 50 on the basis of the signal obtained by adding the two compensation computation results. Obviously, control may be performed by only one of feedback control operation and feedforward control operation. In addition, only one of feedback control operation and feedforward control operation may be performed on the basis of compensation computation processing including a nonlinear computation, as needed.

The conventional apparatus designed to reduce/suppress the vibrations of a vibration suppression target by using an apparatus similar to the linear-acting vibration suppression unit 50 is configured to perform control by using only the linear compensation computation result described above.

However, the movable stroke of the inertial load 52 on the linear-acting vibration suppression unit 50 is finite. For this reason, when large vibrations are caused in the vibration suppression target, and a large control force is required to suppress the vibrations, the inertial load 52 may exceed this stroke range, resulting in function failure. If the inertial load 52 exceeds the allowable stroke range, the inertial load 52 collides with the stopper 54 to restrict the operation range of the inertial load 52. As a consequence, large impact vibrations are produced. If the impact vibrations are detected by the vibration detection unit 3, and a compensation signal is fed back to the linear-acting vibration suppression unit 50, a large signal originating from the impact vibrations is input to the linear-acting vibration suppression unit 50. This may cause an unstable control state. In a control scheme based on only linear compensation computations, to prevent inconveniences caused by collision of the inertial load 52 with the stopper 54, the gain of a linear compensation computation such as integral compensation or proportional compensation performed by the compensation computation section 4 must be decreased to a certain extent. Although the stable operation of the vibration suppression apparatus can be ensured by this operation, the vibration suppression effect is also reduced.

In contrast to this, in the apparatus described in this embodiment, a relatively high control gain can be used to control vibrations that can be suppressed by a relatively small control force that falls within the sufficiently wide range with respect to the stroke range in which the operation of the inertial load 52 is limited by the stopper 54 by using a compensation computation including a nonlinear computation process like that described above. Therefore, an excellent vibration reducing effect can be obtained. If large vibrations are produced, this apparatus performs operation equivalent to a control operation with a relatively low control gain. For this reason, the control force generated by the linear-acting vibration suppression unit 50 is suppressed, and stable vibration control can be performed without causing any stroke over of the inertial load 52.

According to the active vibration suppression apparatus of this embodiment, even if severe restrictions are imposed on the movable stroke, mass, and the like, of an inertial load, both a vibration suppressing effect and stable operation in the presence of large vibrations can be realized, and maximum vibration suppression performance can be obtained under the restrictions.

Second Embodiment

Figure 8:
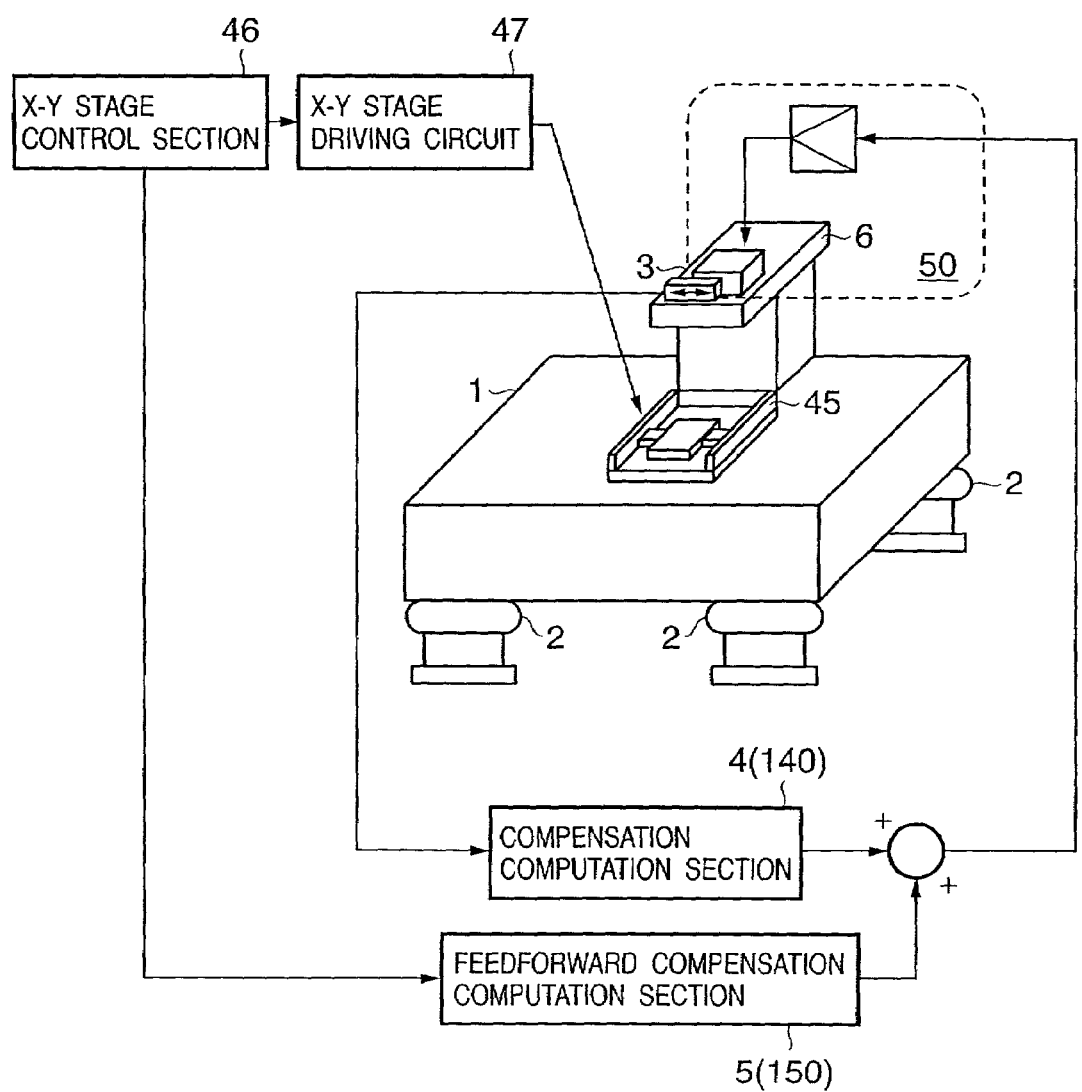
FIG. 8 is a view showing the arrangement of an active vibration suppression apparatus according to the second and third embodiments of the present invention.

FIG. 8 is a view showing an example of the arrangement of an apparatus according to the second embodiment of the present invention, which is configured to reduce the vibrations of a structure 6 mounted on a vibration isolation base 1.

In the first embodiment, the apparatus according to the present invention has been described in detail with reference to the case wherein the vibration isolation base 1 is a vibration suppression target. The second embodiment will exemplify the case wherein local resonance vibrations produced in the structure 6 fastened to the vibration isolation base 1 with relatively high rigidity are reduced/suppressed by an active vibration suppression apparatus according to the present invention. A vibration suppression target in this embodiment is not the natural vibrations of the vibration system constituted by the vibration isolation base 1 and a support mechanism 2, but is the structural resonance vibrations of the structure 6 fastened to the vibration isolation base 1 with relatively high rigidity. In a semiconductor exposure apparatus, a structure that supports an optical unit, measuring system, and the like, corresponds to this structure 6.

The arrangement of the apparatus of this embodiment differs from that of the first embodiment in that a linear-acting vibration suppression unit 50 and vibration detection unit 3 are mounted on the structure 6 fastened to the vibration isolation base 1, instead of being mounted on the vibration isolation base 1. This embodiment differs from the first embodiment in that the vibration detection unit 3 detects the vibrations of the structure 6 serving as a vibration suppression target, and the linear-acting vibration suppression unit 50 applies a control force to the structure 6. In other respects, the constituent elements and operation of this embodiment are basically the same as those of the first embodiment. However, the operations of a compensation computation section 140 and feedforward compensation computation section 150 are slightly different from those in the first embodiment, and hence only these portions will be described below.

The compensation computation section 140 according to this embodiment will be described first.

The vibration system constituted by the vibration isolation base 1 and support mechanism 2, which serves as the vibration suppression target in the first embodiment, has a relatively low natural frequency of 10 Hz or less. The structure 6 serving as a vibration suppression target in this embodiment structurally resonates at a frequency of several tens of Hz or more. The control force required by the linear-acting vibration suppression unit 50 to reduce/suppress the resonance vibrations of the structure 6 contains a relatively high frequency component as compared with the first embodiment. The control force generated by the linear-acting vibration suppression unit 50 is proportional to the drive reaction force of an inertial load 52, i.e., the operating acceleration of the inertial load 52. As is generally known, even if given objects operate at the same acceleration, the operation displacement amount of one of the objects which exhibits a higher operating frequency component becomes smaller. For this reason, the operation range of the inertial load 52, which is required to reduce/suppress the resonance vibrations of the structure 6, is narrower than that in the first embodiment, resulting in a decrease in the possibility of an occurrence of stroke over. The apparatus according to this embodiment can, therefore, effectively reduce/suppress the vibrations of the structure 6 while suppressing the operation stroke of the inertial load 52 to be small by extracting a structural resonance component from the vibrations of the structure 6. The natural vibration component with a relatively low frequency of the vibration system constituted by the vibration isolation base 1 and support mechanism 2 extracted from the control signal by performing appropriate filter processing for the signal output from the vibration detection unit 3 or adjusting the rigidity with which the inertial load 52 is kept at a predetermined neutral position by using a passive/active means.

If, however, the natural frequency of the vibration system constituted by the vibration isolation base 1 and support mechanism 2 is relatively near the resonance frequency of the structure 6, it is difficult to eliminate the influence of the natural vibrations of the vibration system constituted by the vibration isolation base 1 and support mechanism 2 even by performing these processes. As a result, this low-frequency component is input to the control system of the active vibration suppression apparatus, and increases the operation stroke of the inertial load 52.

In this embodiment, therefore, a compensation computation including a nonlinear computation is performed as in the first embodiment. More specifically, when the resonance vibrations of the structure 6 are to be damped by feeding back a control force proportional to the vibration velocity of the structure 6, a nonlinear function like equation (1), which has been described in detail in the first embodiment, is used. That is, the apparatus according to this embodiment performs a linear compensation computation for a detection signal from the vibration detection unit 3, and performs a nonlinear computation like equation (1) for the computation result, thereby controlling the linear-acting vibration suppression unit 50 by using the resultant signal. Since this embodiment is aimed at reducing/suppressing the resonance vibrations of the structure 6, in order to minimize the influence of the low-frequency natural vibrations of the vibration system constituted by the vibration isolation base 1 and support mechanism 2, appropriate filter processing is preferably performed as a pre-process for a linear compensation computation.

With this control, even if the inertial load 52 may be greatly swung by a vibration component, which is not a vibration suppression target, an excellent vibration reducing effect can be ensured with a relatively high control gain with respect to vibrations that can be controlled by a control force falling within a sufficiently wide range with respect to the stroke range in which the operation of the inertial load 52 is limited by a stopper 54. If large vibrations are produced, stable vibration control can be realized without any stroke over of the inertial load 52 by operation equivalent to a control operation with a relatively low control gain. That is, maximum vibration suppression performance can be obtained under restrictions.

Control operation based on the same concept as described above can also be applied to the feedforward compensation computation section 150. That is, a compensation computation using both a linear compensation computation and a nonlinear compensation computation can be performed.

Assume that the structure 6 serving as the vibration suppression target is not fastened to an X-Y stage 45 having a driving means with sufficient rigidity, unlike in this embodiment, and resonance vibrations are produced in the structure 6. In this case, the apparatus must perform a compensation computation different from that in the first embodiment, i.e., perform a linear compensation computation, on the basis of a signal proportional to the drive acceleration of the X-Y stage 45 or its drive reaction force, to apply a control force proportional to the signal to the vibration isolation base 1 in a desired control band. In consideration of the mechanical rigidity between the X-Y stage 45 and the structure 6, compensation must be performed to generate a signal for allowing the linear-acting vibration suppression unit 50 to cancel the vibrations produced in the structure 6 by the operation of the X-Y stage 45. This embodiment is different from the first embodiment in this point.

Note that the maximum vibration suppression performance can be obtained under the restriction of the allowable stroke of the inertial load 52 by performing a nonlinear compensation computation using the feedforward compensation computation section 150 as in the first embodiment. This is a significant advantage obtained by the present invention.

Figure 9A:
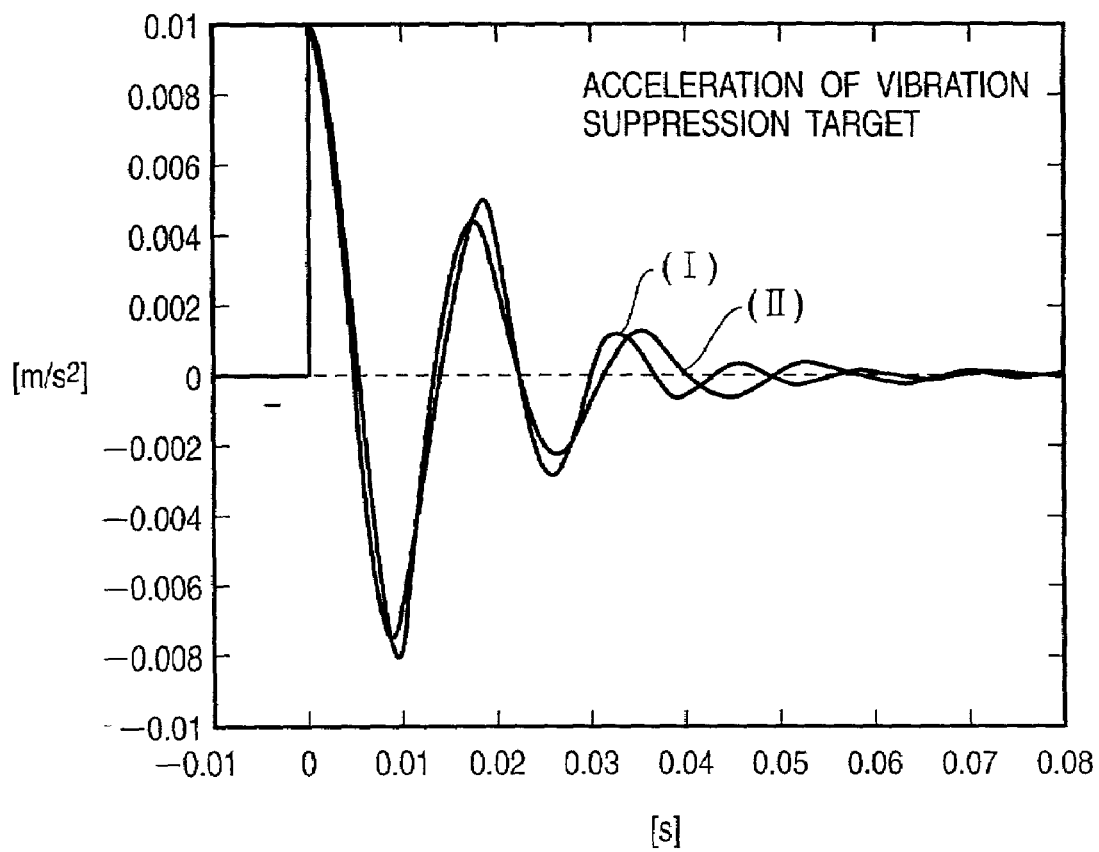
FIGS. 9A and 9B are graphs showing the simulation results obtained from the apparatus according to the present invention.
Figure 9B:
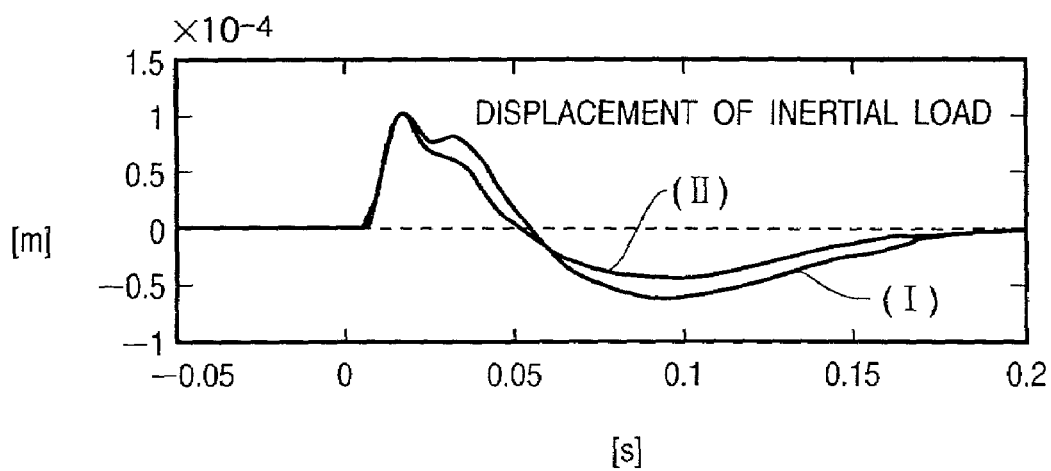

FIGS. 9A and 9B show the simulation results obtained when the resonance vibrations of a structure of this type are reduced/suppressed by feedback control operation using the compensation computation section 140. Referring to FIGS. 9A and 9B, the abscissa represents the time elapsed since the occurrence of vibrations in the vibration suppression target, and the ordinate represents the acceleration of the vibration suppression target in FIG. 9A, and the displacement amount of the inertial load in FIG. 9B. Referring to FIGS. 9A and 9B, each curve indicated by "(I)" represents the control result based on the result of a compensation computation including a nonlinear compensation computation, and each curve indicated by "(II)" represents the control result based on only a conventional linear compensation computation. In this case, in a compensation computation including a nonlinear compensation computation, a compensation computation based on a nonlinear function represented by equation (1) is performed for a signal similar to the one indicated by "(II)" for which a linear compensation computation has been performed.

As is apparent from this result, the vibrations of the vibration suppression target can be quickly reduced without increasing the maximum amount of displacement from the neutral position of the inertial load 52 by properly using a nonlinear compensation computation.

As described above, according to the active vibration suppression apparatus of this embodiment, even if severe restrictions are imposed on the movable stroke, mass, and the like, of an inertial load, both a vibration suppressing effect and stable operation in the presence of large vibrations can be realized, and the resonance vibrations of the structure mounted on the vibration isolation base can be stably and effectively reduced/suppressed.

Third Embodiment

The third embodiment of the present invention will exemplify the following semiconductor exposure apparatus having the active vibration suppression apparatus shown in FIG. 8 to reduce vibrations that affect the exposure performance.

In the third embodiment, an apparatus will be described, which has an active vibration suppression apparatus mounted on a structure having a cantilever structure, which is a component of a semiconductor exposure apparatus to reduce/suppress structural vibrations centered on the cantilever fulcrum of the structure. In this case, an embodiment will be described, in which a structure having a cantilever support structure and serving as a vibration suppression target is a mechanical structure as a component of an illumination optical unit for emitting exposure light to expose a silicon wafer as a substrate to a circuit pattern formed on a reticle as a master plate through an optical lens system.

Figure 10:
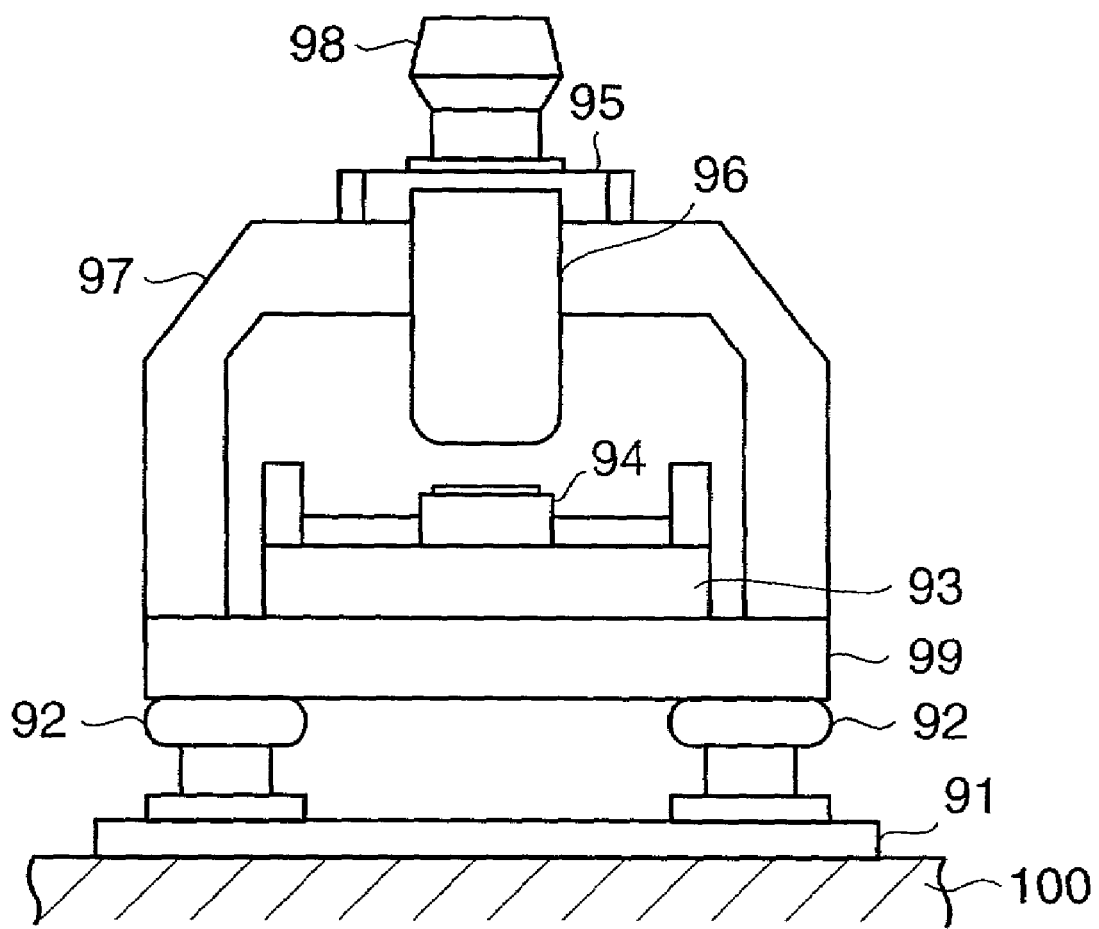
FIG. 10 is a view showing an example of the arrangement of a semiconductor exposure apparatus having the active vibration suppression apparatus according to the third embodiment of the present invention.

FIG. 10 is a view showing an embodiment of the arrangement of a semiconductor exposure apparatus.

In the apparatus shown in FIG. 10, a wafer stage 94, on which a silicon wafer as a substrate which is to be exposed to a circuit pattern and a stage surface plate 93 on which the wafer stage 94 is mounted, are placed on an apparatus mount pedestal 100 through a vibration isolation support mechanism such as a vibration isolation apparatus 92. Both the stage surface plate 93 and a lens barrel surface plate 97 are rigidly fastened to a surface plate 99 and supported by the vibration isolation apparatus 92. A reticle stage 95 and optical lens system 96 are mounted on the lens barrel surface plate 97. The optical lens system 96 is used to project the pattern of a master plate called a reticle, having a circuit pattern, which is mounted on the reticle stage 95, onto a silicon wafer.

The vibration isolation apparatus 92 is not directly installed on the apparatus mount pedestal 100 but is fixed to a pedestal structure 91 called a pallet or base plate. The pedestal structure 91 serves as a reference for maintaining the relative positional relationship between the devices mounted on the vibration isolation apparatus 92 and components, such as a wafer feeder, reticle changer, and light source (which are not shown in FIG. 10) and not mounted on the vibration isolation apparatus 92, or a pedestal member on which the overall semiconductor exposure apparatus is mounted to be transported altogether. A level adjusting mechanism with high rigidity (not shown in FIG. 10), called a leveling block, or the like, is provided under the pedestal structure 91. By adjusting this mechanism in accordance with the condition of the apparatus mount pedestal 100, the semiconductor exposure apparatus can be installed in a predetermined posture.

As the vibration isolation apparatus 92, an active vibration isolation apparatus, or the like, is used, which detects the vibrations of the surface plate 99 with a sensor, or the like, and controls an actuator for applying a control force to the surface plate 99 on the basis of the signal obtained by compensating for the detection signal, thereby reducing the vibrations.

The optical lens system 96 is set between the reticle stage 95 and the wafer stage 94. A reticle is irradiated with exposure light emitted from an illumination optical unit 98 to project a circuit pattern formed on the reticle onto a silicon wafer through the optical lens system 96 by exposure.

Semiconductor exposure apparatuses are classified into cell projection type apparatuses (steppers), scan exposure type apparatuses (scanners), and the like, according to the exposure schemes. In a case of a cell projection type apparatus, a predetermined exposure area, e.g., an area corresponding to one integrated circuit such as an IC, is exposed at once while the wafer stage 94 is sequentially driven by an intermittent driving scheme called a step-and-repeat scheme. In a case of a scan exposure type apparatus, the wafer stage 94 and reticle stage 95 are synchronously operated to scan/expose a wafer in a circuit pattern formed on a reticle. In the case of the scan exposure type apparatus, the reticle stage 95 is driven with a large operation by a relatively large driving force as compared with the driving force required in the cell projection type apparatus.

Such a semiconductor exposure apparatus is apt to be easily affected by the vibrations produced when the wafer stage 94 or reticle stage 95 is driven and vibrations are transmitted from the apparatus mount pedestal 100. For this reason, in this embodiment, vibrations produced in a structure as a component of the semiconductor exposure apparatus are reduced/suppressed by using an active vibration suppression apparatus to be described below. This embodiment will exemplify the case wherein vibrations such as structural resonance produced in a mechanical structure as a component of the illumination optical unit 98, are reduced/suppressed.

The third embodiment of the present invention will be described below with reference to a case wherein an active vibration suppression apparatus according to the present invention is applied to the semiconductor exposure apparatus having the arrangement shown in FIG. 10. For the sake of convenience, the active vibration suppression apparatus will be described with reference to FIG. 8.

The active vibration suppression apparatus schematically shown in FIG. 8 is comprised of a vibration isolation base 1, a support mechanism 2 for vibration-isolating/supporting the vibration isolation base 1, an X-Y stage 45 mounted on the vibration isolation base 1, a structure 6 fastened to the vibration isolation base 1 with relatively high rigidity, and the like. The vibration isolation base 1, support mechanism 2, and structure 6 respectively correspond to the surface plate 99, vibration isolation apparatus 92, and illumination optical unit 98 described with reference to FIG. 10. The X-Y stage 45 corresponds to one of the wafer stage 94 and reticle stage 95. The wafer stage 94 and reticle stage 95 are respectively mounted on the stage surface plate(s) 93 and lens barrel surface plate 97. These surface plates 93 and 97 are rigidly fastened to the surface plate 99. Since these stage apparatuses are equivalently mounted on the surface plate 99 from the viewpoint of dynamics, the X-Y stage 45 is mounted on the vibration isolation base 1 in FIG. 8.

The structure 6 has a cantilever support structure as shown in FIG. 8.

In this case, the structure 6 is set as a component of the illumination optical unit 98.

As described above, the illumination optical unit 98 is used to emit exposure light for projecting a circuit pattern formed on a reticle onto a silicon wafer through the optical lens system 96, and hence, is set on an extension line from the optical lens system 96 and reticle. If, therefore, the optical axis of exposure light is set in the vertical direction as in the semiconductor exposure apparatus shown in FIG. 10, the illumination optical unit 98 must be designed to locate an exposure light irradiation opening immediately above the optical lens system 96 and the reticle. In such cases, the structure of the illumination optical unit 98 must often be formed by a cantilever structure like the one schematically shown in FIG. 8, owing to the layout design of structures constituting the exposure apparatus.

Figure 15:
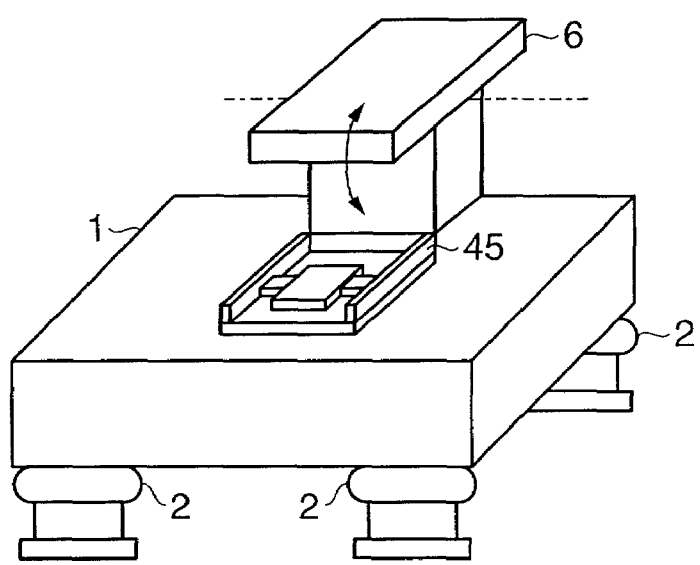
FIG. 15 is a perspective view for explaining an example of the vibration mode of a structure in a semiconductor exposure apparatus.
Figure 16:
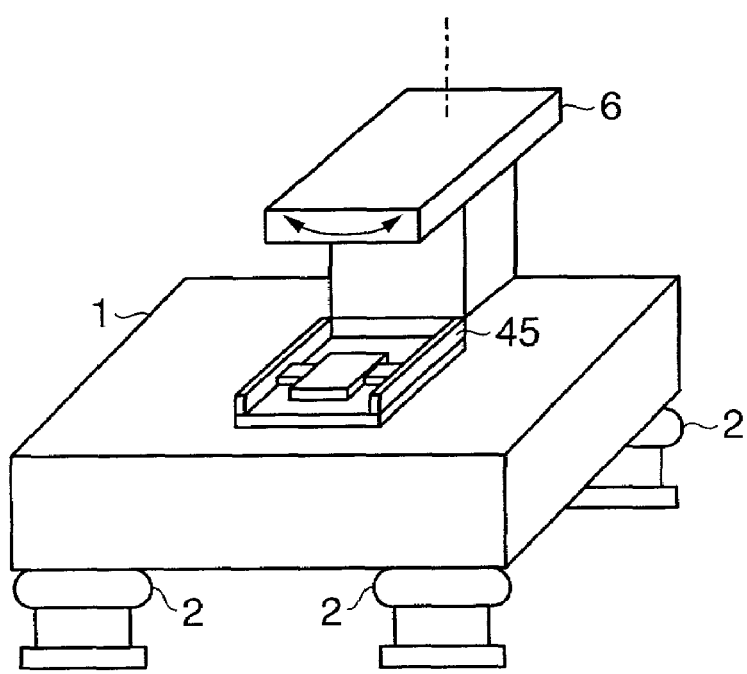
FIG. 16 is a perspective view for explaining another example of the vibration mode of the structure in the semiconductor exposure apparatus.
Figure 17:
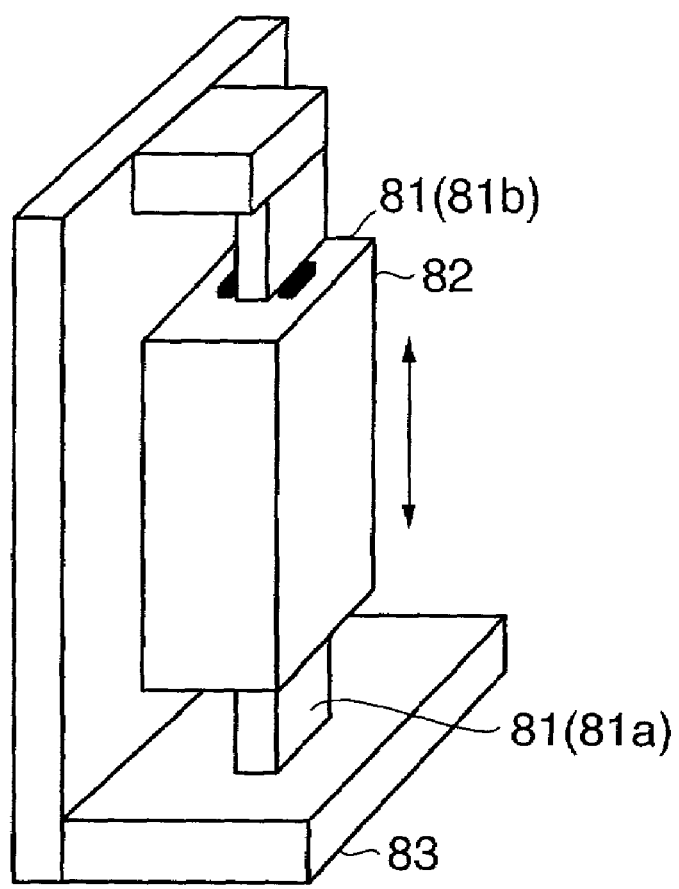
FIG. 17 is a perspective view showing an example of an actuator acting in the vertical direction, which is used in a linear-acting vibration suppression apparatus.
Figure 18:
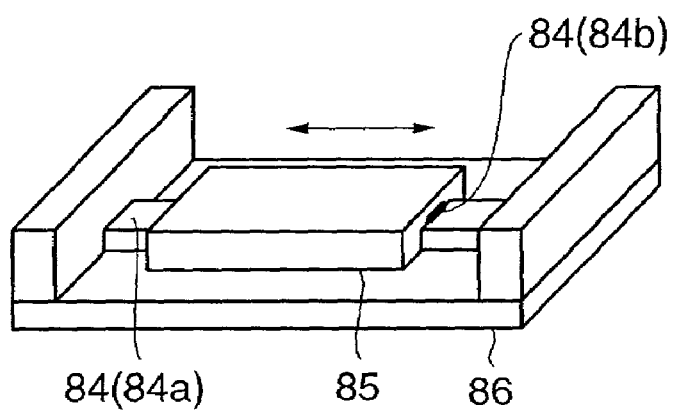
FIG. 18 is a perspective view showing an example of an actuator acting in the horizontal direction, which is used in the linear-acting vibration suppression apparatus.

In a structure having such an arrangement, vibrations in the rotational motion direction centered on the fulcrum tend to be produced. FIGS. 15 and 16 show examples of rotational vibrations originating from the cantilever support structure 6. FIG. 15 shows an example of rotational vibrations around the horizontal axis centered on the cantilever fulcrum. FIG. 16 shows an example of rotational vibrations around the vertical axis. Referring to FIGS. 15 and 16, each arrow indicates the direction of rotational vibrations, and each chain line indicates the center axis of rotational vibrations. FIG. 8 shows an example of the apparatus for reducing/suppressing rotational vibrations around the vertical axis in FIG. 16.

In this embodiment, an apparatus for reducing/suppressing the vibrations of such a structure and its operation will be described.

The apparatus having the above arrangement according to this embodiment includes a linear-acting vibration suppression unit 50 for applying a control force to the structure 6 serving as a vibration suppression object in this case, a vibration detection unit 3 for detecting the vibrations of the structure 6, a compensation computation section 4 for performing appropriate compensation computation processing for a signal corresponding to the vibrations of the vibration suppression target on the basis of an output signal from the vibration detection unit 3, a feedforward compensation computation section 5 for performing compensation computation processing for the operation state of equipment such as the X-Y stage 45 mounted on the vibration isolation base 1 or a signal from the control section of the equipment, and the like.

As shown in FIG. 2, the linear-acting vibration suppression unit 50 is fixed on the structure 6 as the vibration suppression target and is comprised of a linear-acting actuator 51 for generating a thrust in accordance with a driving signal, an inertial load 52 that is connected to the linear-acting actuator 51 and moves in a straight direction relative to the vibration isolation base 1, a base member 53, a stopper 54 for restricting the operation of the inertial load 52 within a predetermined range, a driving circuit 55 for the linear-acting actuator 51, and the like. The driving circuit 55 may not be mounted on the semiconductor exposure apparatus body such as the structure 6 or vibration isolation base 1 and may be kept apart from the linear-acting actuator 51, inertial load 52, and the like.

FIG. 3 is a perspective view showing the linear-acting actuator 51, inertial load 52, and the like. The inertial load 52 is supported by a linear guide, whose detailed arrangement is omitted in FIG. 3, and the like, such that it can move in the direction indicated by an arrow A in FIG. 3. The inertial load 52 is driven in the straight direction indicated by the arrow A by the thrust generated by the linear-acting actuator 51. The linear-acting actuator 51 is comprised of a stator 51a and movable part 51b. The stator 51a is rigidly fastened to the vibration suppression target, whereas the movable part 51b is connected to the inertial load 52 and configured to be movable in a straight direction relative to the vibration suppression target.

As the linear-acting actuator 51, an electromagnetic linear motor can be suitably used, which has a coil winding and permanent magnet mounted on the stator 51a and movable part 51b, respectively, and generates a thrust in the direction indicated by the arrow A in FIG. 3 using the interaction between a current flowing in the coil winding and the magnetic field generated by the permanent magnet. The thrust generated by such an electromagnetic linear motor can be easily controlled by controlling the current flowing in the coil winding by using the driving circuit 55.

Obviously, as the linear-acting actuator 51, other various types of actuators can be used, e.g., an actuator constituted by a rotating electromagnetic actuator, such as a DC servo motor, and a feed screw mechanism for converting the torque produced by the actuator into a thrust in a straight direction to move the inertial load 52 in the straight direction.

As shown in FIG. 2, this linear-acting actuator 51 is fixed to the structure 6, as the vibration suppression target, through the base member 53, and generates a thrust to displace the inertial load 52 in the straight direction relative to the structure 6 as the vibration suppression target. When a thrust is generated in the linear-acting actuator 51 to displace the inertial load 52, a reaction force of the thrust acting on the inertial load 52 acts on the vibration suppression target. The vibration suppression apparatus according to this embodiment uses this reaction force as a control force for vibration control. That is, this vibration suppression apparatus adjusts the driving force generated by the linear-acting actuator 51 to drive the inertial load 52 so as to control a thrust applied as a reaction force to the vibration suppression target.

For the vibration detection unit 3 for detecting the vibrations of the structure 6 as the vibration suppression target, an acceleration sensor, velocity sensor, or the like, can be used.

In this embodiment, to suppress rotational vibrations like those shown in FIG. 16, the linear-acting vibration suppression unit 50 is preferably placed to act in the tangential direction of the rotational vibration direction, at a position as distant as possible from the cantilever fulcrum so as to efficiently act in the motion direction of the rotational vibrations. Likewise, the vibration detection unit 3 is placed to efficiently detect the rotational vibrations. The vibration detection unit 3 is preferably placed near the linear-acting vibration suppression unit 50.

The operation of the vibration suppression apparatus according to this embodiment will be described next with reference to FIG. 8.

The apparatus according to this embodiment performs the control operation of feeding back, to the linear-acting vibration suppression unit 50, the signal obtained by compensating for a signal corresponding to the vibrations of the structure 6 as the vibration suppression target by using the vibration detection unit 3 and compensation computation section 4, the control operation of feeding forward, to the linear-acting vibration suppression unit 50, the operation state of equipment, such as an X-Y stage 45 mounted on the vibration isolation base 1, or information from a control section 46 for the equipment by using the feedforward compensation computation section 5, and the like.

Feedback control operation using the vibration detection unit 3, compensation computation section 4, and the like, will be described first.

In the feedback control operation, the vibration detection unit 3 mounted on the structure 6 is used to detect vibrations produced in the structure 6 by vibrations transmitted from the apparatus mount pedestal or the operation of equipment such as the X-Y stage 45 mounted on the vibration isolation base 1, and the compensation computation section 4 performs an appropriate compensation computation for the resultant detection signal. The linear-acting vibration suppression unit 50 is then driven on the basis of the resultant signal to reduce/suppress the vibrations of the structure 6.

In order to provide a damping property for the structural vibrations of the structure 6, the compensation computation section 4 performs a compensation computation to make the linear-acting vibration suppression unit 50 apply a control force proportional to the vibration velocity of the structure 6 to the structure 6. When an acceleration sensor is used as the vibration detection unit 3 and an electromagnetic motor with a high response property is used as the linear-acting actuator 51 of the linear-acting vibration suppression unit 50, the compensation computation section 4 may mainly perform an integral compensation computation as a compensation computation for a signal corresponding to the vibration acceleration of the structure 6, which is detected by the vibration detection unit 3. Some electromagnetic motors exhibit an excellent response property up to a frequency higher than the resonance frequency of the structure 6. For this reason, in a frequency region near the natural frequency, which requires a damping property, the electromagnetic motor receives a driving current command and can instantaneously generate a thrust almost equal to the thrust designated by the signal. The compensation computation section 4 may perform integral computation for the acceleration signal of the structure 6, detected by the vibration detection unit 3, to obtain a signal proportional to the velocity, and feed back this signal. Obviously, according to the same concepts as described above, when a velocity sensor is used as the vibration detection unit 3, the compensation computation section 4 may perform a proportional compensation computation.

In this case, the compensation computation section 4 performs a compensation computation to provide a damping property for the structural vibrations of the structure 6. However, signals associated with acceleration, velocity, and vibration may be properly combined or a combination of linear compensation computations other than an integral compensation computation and proportional compensation computation may be applied together to control the vibrations of the structure 6 to an appropriate state.

In general, the structure 6 serving as the vibration suppression target produces structural resonance vibrations at a frequency of several tens of Hz or more, whereas the vibration system constituted by the vibration isolation base 1, on which the structure 6 is fastened and mounted, and the support mechanism 2 has a relatively low natural frequency of 10 Hz or less. For this reason, if the low-frequency natural vibrations of the vibration system constituted by the vibration isolation base 1 and support mechanism 2 are detected by the vibration detection unit 3 and input to the control system of the active vibration suppression apparatus, the operation stroke of the inertial load 52 mounted on the linear-acting vibration suppression unit 50 may be unnecessarily increased due to the influence of the vibrations.

In this case, the vibration suppression target is the structural resonance of the structure 6. Therefore, the compensation computation section 4 performs computation processing to effectively reduce/suppress the vibrations of the structure 6 while keeping the operation stroke of the inertial load 52 small by performing, in addition to the compensation processing described above, the processing of performing appropriate filter processing for an output signal from the vibration detection unit 3 and cutting a natural vibration component having a relatively low frequency from the vibration system constituted by the vibration isolation base 1 and support mechanism 2 to extract a structural resonance component from the structure 6, the processing of providing rigidity to restore the inertial load 52 to a predetermined neutral position by using an active means, or the like. As the means for providing rigidity to restore the inertial load 52 to the predetermined neutral position, a passive element such as a spring mechanism may be used.

The compensation computation performed by the compensation computation section 4 is not limited to the linear compensation computation described above. Obviously, various nonlinear computations, e.g., nonlinear computation processing like that described in the first and second embodiments, can be applied in accordance with the application or purpose.

The feedback control operation of the active vibration suppression apparatus according to this embodiment can be implemented by controlling the linear-acting vibration suppression unit 50 on the basis of a signal obtained by the compensation computation section 4 after performing such computation processing.

Feedforward control operation using the feedforward compensation computation section 5 will be described next.

The feedforward compensation computation section 5 serves to generate a signal for appropriate vibration control by performing compensation computation for a signal representing the operation state of equipment such as the X-Y stage mounted on the vibration isolation base 1. Feedforward control operation will be described in detail below.

Assume that the equipment having a driving means such as the X-Y stage 45 is mounted on the vibration isolation base 1, as shown in FIG. 8. This X-Y stage 45 is driven by an electromagnetic linear motor, or the like. The electromagnetic linear motor for driving the X-Y stage 45 is driven by an X-Y stage driving circuit 47 on the basis of a signal from the X-Y stage control section 46.

The feedforward compensation computation section 5 performs appropriate computation processing to make the linear-acting vibration suppression unit 50 effectively reduce/suppress vibrations produced in the structure 6 by the drive reaction force of the X-Y stage 45 on the basis of a signal from the X-Y stage control section 46 or a signal associated with the driven state of the X-Y stage 45. In consideration of the dynamic characteristics between the drive reaction force of the X-Y stage 45 and the vibrations produced in the structure 6 by the reaction force, the mechanical rigidity between the X-Y stage 45 and the structure 6, and the like, the feedforward compensation computation section 5 performs compensation processing to generate a signal for canceling the vibrations produced in the structure 6 by the operation of the X-Y stage 45. Obviously, this compensation computation is not limited to a linear compensation computation, and the nonlinear computation described above can be applied as the compensation computation or used together.

The feedforward control operation of the active vibration suppression apparatus according to this embodiment can be implemented by controlling the linear-acting vibration suppression unit 50 on the basis of the signal obtained by the feedforward compensation computation section 5 in this manner.

Although feedback control operation and feedforward control operation have been separately described, both feedback control operation and feedforward control operation can be simultaneously performed by driving the linear-acting vibration suppression unit 50 on the basis of the signal obtained by adding the two compensation computation results. Obviously, control may be performed by only one of feedback control operation and feedforward control operation.

In this embodiment, one linear-acting vibration suppression unit 50 is used to reduce/suppress the vibrations of the structure 6. However, a plurality of linear-acting vibration suppression units, each identical to the one described above, and their control systems, may be prepared to obtain a desired vibration suppressing effect.

In this embodiment, a cantilever support structure has been described as the vibration suppression target. However, the linear-acting vibration suppression unit 50 may be mounted on a structure having a vibration mode other than that of the cantilever support structure at a position corresponding to an antinode of the vibration mode at which vibrations appear most noticeably in order to reduce the vibrations. In this case, as well, the vibration detection unit 3 is preferably placed near the linear-acting vibration suppression unit 50.

In the semiconductor exposure apparatus having the above active vibration suppression apparatus, since the various structural vibrations of the exposure apparatus, e.g., the structural resonance of a cantilever support structure, such as a mechanical structure as a component of the illumination optical system, can be reduced/suppressed, the adverse effect of such vibrations on equipment can be reduced or eliminated. Therefore, a high-performance semiconductor exposure apparatus with a high precision and high throughput can be realized.

Fourth Embodiment

An active vibration suppression apparatus designed to act in the rotational motion direction may be suitably used to reduce/suppress vibrations centered on the fulcrum of a cantilever support structure, like the vibration suppression target in the third embodiment, in the rotational direction. In the fourth embodiment of the present invention, a semiconductor exposure apparatus having a structure desired to suppress the vibrations of such a structure by using an active vibration suppression apparatus acting in the rotational motion direction will be described.

This embodiment will be described with reference to FIG. 11.

Basically, this embodiment will also be described with reference to the case wherein the vibrations of the semiconductor exposure apparatus shown in FIG. 10 are to be reduced. Since the same reference numerals as those in FIG. 11 denote the same structures and functions in the apparatus in FIG. 8, and they operate in the same manner, a detailed description thereof will be omitted. In addition, the direction of vibrations to be reduced/suppressed is also the same as that in the third embodiment, which is indicated by the arrow in FIG. 16.

Figure 11:
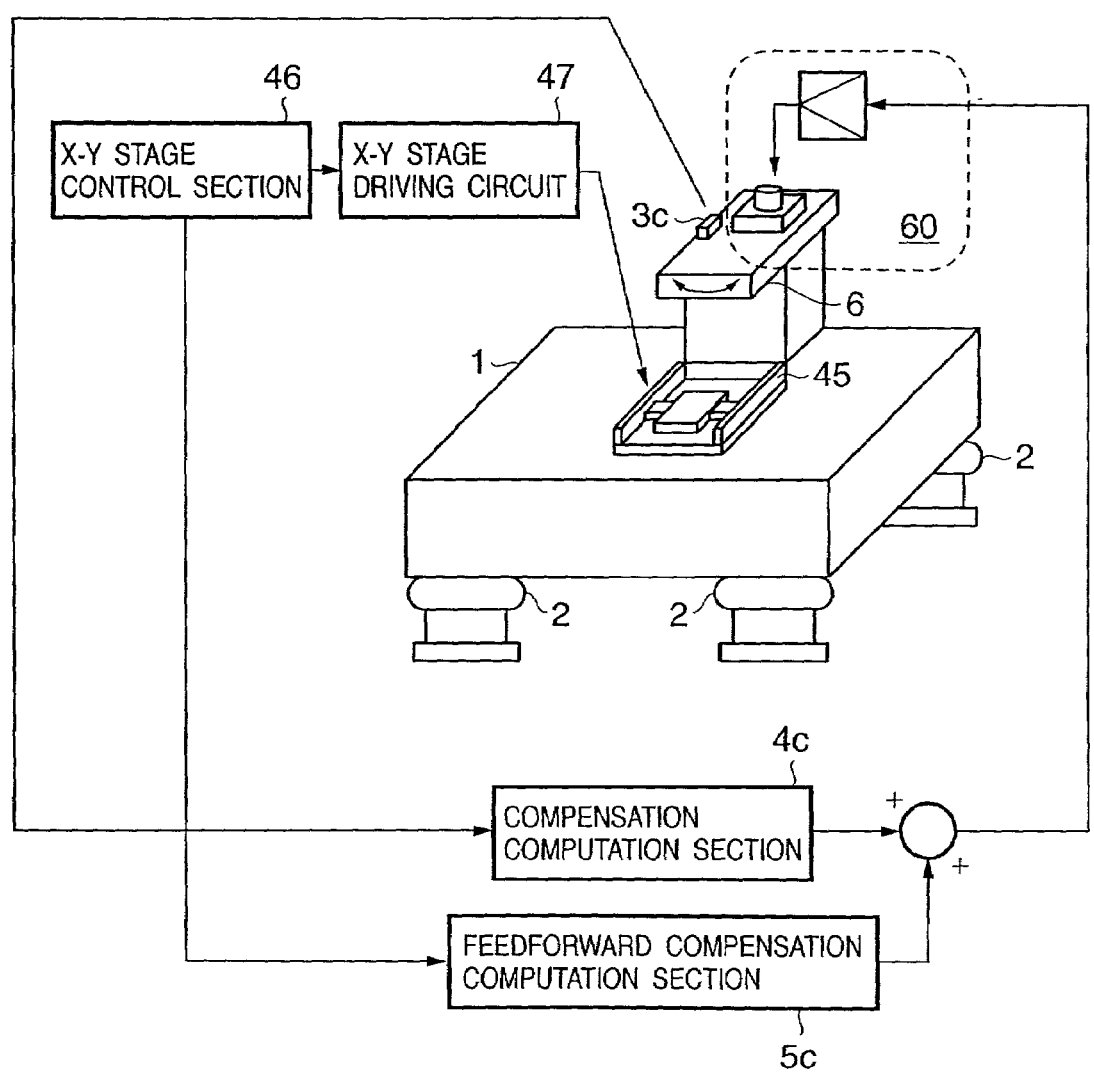
FIG. 11 is a view showing the fourth embodiment of the present invention.
Figure 12:
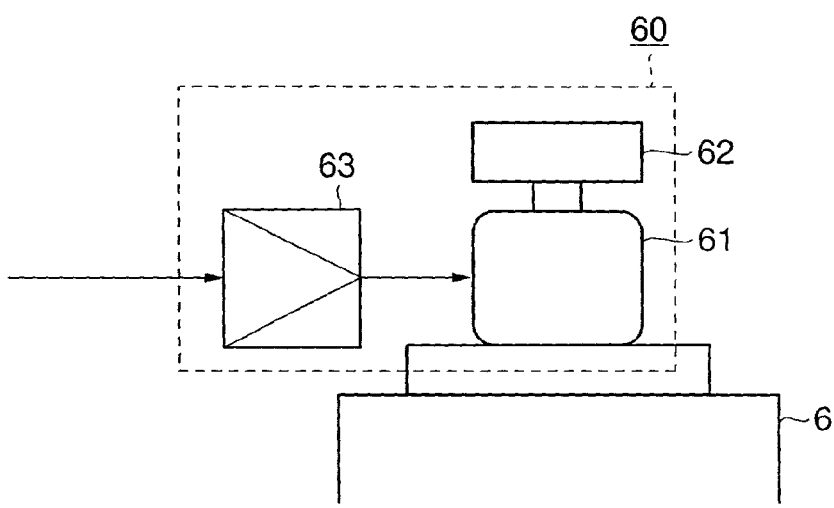
FIG. 12 is a view showing the arrangement of a rotational vibration suppression unit according to an embodiment of the present invention.

As shown in FIG. 11, the apparatus according to this embodiment has a rotational vibration suppression unit 60 instead of the linear-acting vibration suppression unit 50 described in the third embodiment. In this embodiment, a rotational vibration detection unit 3c for detecting predetermined rotational vibrations of a structure 6 as a vibration suppression target is used to detect the vibrations of the structure 6, and a compensation computation section 4c is used as a means for performing an appropriate compensation computation for a detection signal from the rotational vibration detection unit 3c. A feedforward compensation computation section 5c, or the like, is used as a means for performing a compensation computation for a signal representing the operation state of equipment such as an X-Y stage 45 mounted on the vibration isolation base 1.

As the rotational vibration detection unit 3c, a unit for extracting a vibration component in the rotational direction of the structure 6 by performing a computation on the basis of output signals from a plurality of vibration sensors arranged on the structure 6, an angular velocity sensor for directly detecting the motion amount of the structure 6 in the rotational direction, or the like, can be used. In the former case, acceleration sensors, velocity sensors, or the like, can be used as the vibration sensors. These vibration sensors are arranged such that their detection axes are not aligned. A signal corresponding to desired rotational vibrations is extracted according to an arithmetic expression on the basis of output signals from these vibration sensors.

Note that the direction of rotational vibrations to be detected coincides with the direction in which a torque is generated by the rotational vibration suppression unit 60, i.e., the direction of rotational vibrations to be reduced/suppressed in this case.

The rotational vibration suppression unit 60 is fixed to the structure 6 and is comprised of a rotational actuator 61 for generating a torque in accordance with a driving signal, a flywheel 62 connected to the rotational actuator 61 and serving as an inertial load that moves in the rotational direction relative to the structure 6, a driving circuit 63 for the rotational actuator 61, and the like.

Figure 13:
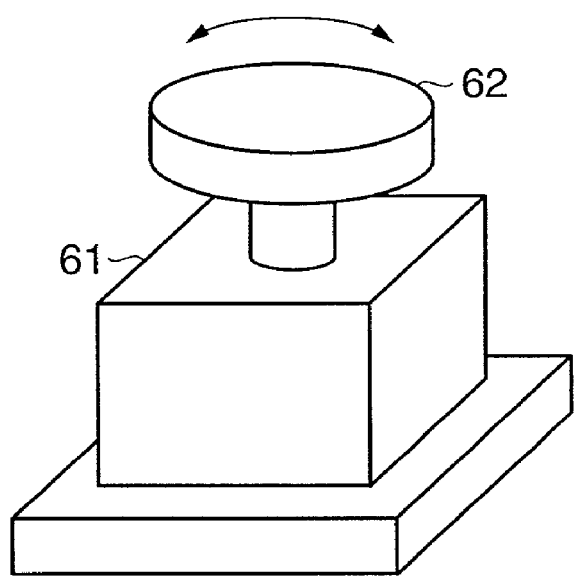
FIG. 13 is a perspective view showing a rotating actuator and flywheel according to an embodiment of the present invention.

FIG. 13 is a perspective view showing the rotational actuator 61 and flywheel 62. The flywheel 62 is driven in the rotational direction by the torque generated by the rotational actuator 61. The rotational actuator 61 is comprised of a stator and rotator, one of which is rigidly fastened to the structure 6, while the flywheel 62 is fastened to the other to be movable in the rotational direction relative to the structure 6. The rotational vibration suppression unit 60 is preferably placed such that the extension line of its center axis passes through the rotation center position of the rotational vibrations of the vibration suppression target.

As the rotational actuator 61, one of various types of electromagnetic motors, e.g., a DC motor, a synchronous AC motor, an induction AC motor, and a swing electromagnetic motor, can be used. Note that these actuators are disclosed in detail in "Active Vibration Suppression Apparatus", Japanese Patent Application No. 2000-122731, and the like.

When this rotational actuator 61 is driven, the flywheel 62 is driven in the rotational direction by the resultant torque, as indicated by the arrow in FIG. 13. A torque acts on the structure 6 in the direction indicated by the arrow in FIG. 11 as a result of the drive reaction force generated in the rotational direction at this time. The rotational vibration suppression unit 60 according to this embodiment controls the torque acting on the structure 6 by using this reaction torque.

The operation of the apparatus according to this embodiment will be described below with reference to FIG. 11.

The apparatus according to this embodiment performs the control operation of feeding back a compensation signal for the vibrations of the structure 6 to the rotational vibration suppression unit 60 by using the rotational vibration detection unit 3c, compensation computation section 4c, and the like, and the control operation of feeding forward information about the operation state of equipment having a driving means that influences the structure 6 to the rotational vibration suppression unit 60 by using the feedforward compensation computation section 5c.

Feedback control operation using the rotational vibration detection unit 3c and compensation computation section 4c will be described first.

In this control operation, first of all, rotational vibrations produced in the structure 6 by the vibration transmission from the apparatus mount pedestal or the operation of equipment such as the X-Y stage 45 mounted on a vibration isolation base 1 are detected by using the rotational vibration detection unit 3c. FIG. 11 shows a case wherein an angular velocity sensor is used as the rotational vibration detection unit 3c. The compensation computation section 4c then performs appropriate compensation computation processing on the basis of the detection signal obtained by the sensor.

When, for example, a damping property is to be provided for the rotational vibrations of the structure 6, a computation is performed to apply a torque proportional to the angular velocity of the structure 6 to the structure 6. If an angular velocity sensor is used as the rotational vibration detection unit 3c and an electromagnetic DC motor, or the like, having a high response property is used as the rotational actuator 61 of the rotational vibration suppression unit 60, this operation can be realized by causing the compensation computation section 4c to perform a proportional compensation computation for a signal corresponding to desired rotational vibrations. A DC motor can be manufactured to exhibit an excellent response property up to a frequency higher than the resonance frequency of the structure 6. For this reason, by using such a DC motor, a torque almost equal to the torque designated by a current driving command signal can be instantaneously generated in a main control band requiring a damping property. If, therefore, the signal obtained by performing gain compensation for the detection signal obtained by the angular velocity sensor is input to the driving circuit 63 of the rotational vibration suppression unit 60, a damping property can be provided to the rotational vibrations of the structure 6.

Although a compensation computation in the compensation computation section 4c has been described with reference to the case wherein an angular velocity sensor is used to provide a damping property to the rotational vibrations of the structure 6, the rotational vibrations of the structure 6 may be controlled to a proper state by using a sensor other than the angular velocity sensor and a physical quantity and performing an appropriate compensation computation in accordance with the application of the detection signal obtained by the sensor. A compensation computation may be a nonlinear compensation computation or a compensation computation including a nonlinear computation.

Operation using the feedforward compensation computation section 5c will be described next.

The feedforward compensation computation section 5c performs a compensation computation for the operation state of equipment, such as the X-Y stage 45, mounted on the vibration isolation base 1 or a signal from the control section 46 for the X-Y stage, thus performing a computation for generating a signal for appropriate vibration control.

Assume that equipment having a driving means, e.g., the X-Y stage 45, is mounted on the vibration isolation base 1, as shown in FIG. 11. This X-Y stage 45 is driven by an electromagnetic linear motor, or the like. The electromagnetic linear motor for driving the X-Y stage 45 is driven on the basis of a signal from an X-Y stage control section 46 through the X-Y stage driving circuit 47. Since the X-Y stage 45 cannot always be installed at the center of gravity of the overall apparatus constituted by the vibration isolation base 1 and the equipment mounted thereon, its drive reaction force is used to generate torques in rotational directions around the horizontal and vertical axes, together with a reaction thrust in the translation direction, thus driving the vibration isolation base 1 and structure 6 in the rotational direction. To effectively reduce/suppress the rotational vibrations of the structure 6 caused by suppressing the influence of such torques, the feedforward compensation computation section 5c is used to perform appropriate computation processing for a signal from the X-Y stage control section 46 or a signal associated with the driven state of the X-Y stage 45 so as to drive the rotational vibration suppression unit 60 on the basis of the computation result.

The feedforward compensation computation section 5c performs a compensation computation to generate a signal for canceling vibrations produced in the structure 6 by the operation of the X-Y stage 45 in consideration of the dynamic characteristics between the drive reaction force for the X-Y stage 45 and vibrations produced in the structure 6 by the drive reaction force and the mechanical rigidity between the X-Y stage 45 and the structure 6. Obviously, this compensation computation is not limited to a linear compensation computation, and a nonlinear computation can be applied as the compensation computation or used together.

The feedforward control operation of the active vibration suppression apparatus according to this embodiment can be implemented by controlling the rotational vibration suppression unit 60 on the basis of the signal obtained by the feedforward compensation computation section 5c in this manner. This makes it possible to effectively reduce/suppress rotational vibrations in the structure 6 by the operation of the X-Y stage 45.

Although feedback control operation and feedforward control operation have been separately described, both feedback control operation and feedforward control operation can be simultaneously performed by driving the rotational vibration suppression unit 60 on the basis of the signal obtained by adding the two compensation computation results. Obviously, control may be performed by only one of feedback control operation and feedforward control operation.

As described in the third embodiment, the rotational vibrations of the structure 6 can also be reduced/suppressed by using an active vibration suppression apparatus using a linear-acting vibration suppression unit. With the active vibration suppression apparatus using only one linear-acting vibration suppression unit, however, since not only a moment in the rotational motion direction, but also a reaction force in the translation direction are produced, a sufficient vibration suppressing effect may not be obtained depending on the position where the apparatus is applied. In some cases, two or more linear-acting vibration suppression units are required to reduce/suppress rotational vibrations.

In contrast to this, according to the apparatus of this embodiment, since the rotational vibration suppression unit constituted by the rotational actuator and flywheel is used as an apparatus for performing vibration suppressing operation in the rotational motion direction, a necessary reaction force, i.e., a necessary torque, can be obtained by using the single vibration suppression unit. The mechanism for generating a reaction force against a rotational motion mode can be made more compact, and hence, an excellent vibration suppressing effect can be obtained even in a precision device with size and weight restrictions being imposed on a space where such an apparatus is mounted.

The active vibration suppression apparatus according to this embodiment is an apparatus for reducing the rotational vibrations of a vibration suppression target. Obviously, this operation can improve the vibration suppressing effect by suppressing vibrations in the translational direction as well as rotational vibrations in cooperation with an active vibration suppression apparatus using a linear-acting vibration suppression unit like the one described in the third embodiment.

Fifth Embodiment

In the fifth embodiment of the present invention, an active vibration suppression apparatus is applied to the reduction of the vibrations of a pedestal structure 91 (shown in FIG. 10), on which the overall semiconductor exposure apparatus, is mounted.

The pedestal structure 91 is basically installed on an apparatus mount pedestal 100 without the mediacy of a vibration isolation support means, and hence, is directly influenced by the vibrations of the apparatus mount pedestal 100. In addition, since the pedestal structure 91 is influenced by its own structural resonance itself, a level adjusting mechanism interposed between the pedestal structure 91 and the apparatus mount pedestal 100 to level the apparatus, and the like, resonance vibrations are also produced in the pedestal structure 91.

The apparatus according to this embodiment has an active vibration suppression apparatus mounted on the pedestal structure 91 to reduce vibrations of this type, thereby decreasing the amount of vibrations transmitted from the apparatus mount pedestal 100 and pedestal structure 91 to the semiconductor exposure apparatus body through the vibration isolation apparatus 92.

Figure 14:
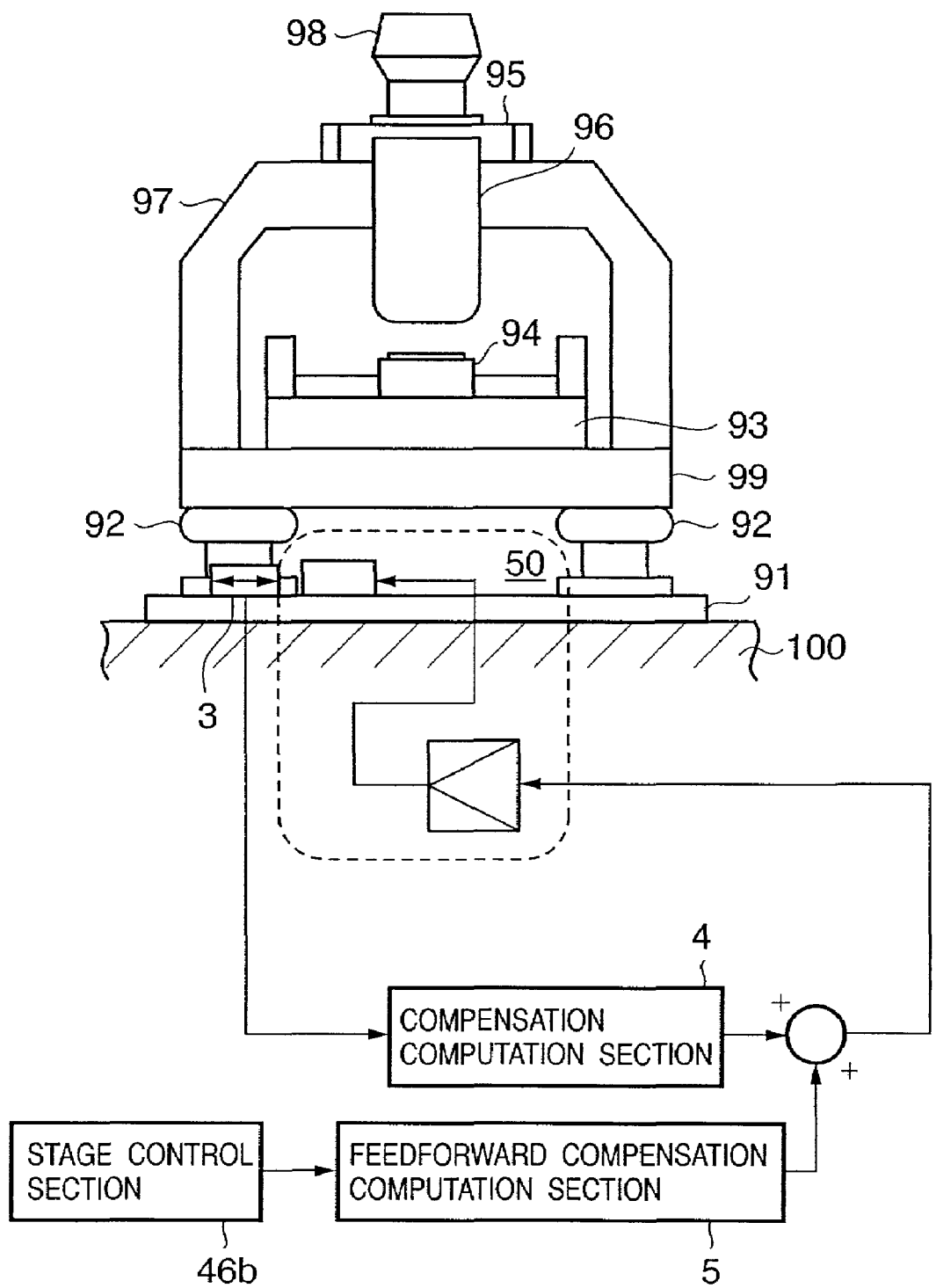
FIG. 14 is a view showing the arrangement of an apparatus according to the fifth embodiment of the present invention.

FIG. 14 shows an example of the structure of the apparatus according to this embodiment. Basically, in this embodiment, an active vibration suppression apparatus is applied to a semiconductor exposure apparatus of the same type as that shown in FIG. 10. The same reference numerals as in FIG. 10 denote the same functions, and the like, in FIG. 14, and a description thereof will be omitted.

In the apparatus according to this embodiment, the linear-acting vibration suppression unit 50 and vibration detection unit 3 described in detail in the third embodiment are mounted on the pedestal structure 91. This apparatus reduces/suppresses the vibrations of the pedestal structure 91 by using a compensation computation section 4 for performing compensation computation processing for a signal corresponding to the vibrations of the pedestal structure 91, which are detected by a vibration detection unit 3, a feedforward compensation computation section 5 for performing a compensation computation based on the operation state of a stage apparatus, such as a wafer stage 94 or reticle stage 95, or a signal from a control section 46*b* for the stage apparatus, and the like.

The operation of the apparatus according to this embodiment will be described next.

The apparatus according to this embodiment also performs the control operation of feeding back the signal obtained by compensating for a signal corresponding to the vibrations of the pedestal structure 91 as a vibration suppression target to a linear-acting vibration suppression unit 50 by using the vibration detection unit 3 or compensation computation section 4, the control operation of feeding forward the operation state of a stage apparatus or information from the stage control section 46*b* as a control section for the stage apparatus to the linear-acting vibration suppression unit 50 by using the feedforward compensation computation section 5, and the like.

Feedback control operation using the vibration detection unit 3, compensation computation section 4, and the like, will be described first. The feedback control operation is performed to reduce/suppress the vibrations of the pedestal structure 91 by detecting vibrations produced in the pedestal structure 91 using the vibration detection unit 3, performing an appropriate compensation computation for the resultant detection signal using the compensation computation section 4, and driving the linear-acting vibration suppression unit 50 on the basis of the resultant signal.

The compensation computation section 4 performs each compensation computation corresponding to a purpose to reduce/suppress the vibrations of the pedestal structure 91. When, for example, a damping property is provided to the structural resonance of the pedestal structure 91, a compensation computation is performed to apply a control force corresponding to the vibration velocity of the pedestal structure 91. Since the specific contents of a compensation computation to be performed in this case are the same as those in the third embodiment, a description thereof will be omitted.

Sky-hook spring control can be effectively applied to the apparatus according to this embodiment aimed at reducing/suppressing the vibrations of the pedestal structure 91 so as to increase the rigidity with respect to a spatial absolute stationary coordinate system by applying a control force proportional to the absolute displacement of the vibrations of the pedestal structure 91 to it. When an acceleration sensor is used as the vibration detection unit 3 and an electromagnetic motor having a high response property is used as linear-acting actuator 51 of the linear-acting vibration suppression unit 50, this control can be implemented by making the compensation computation section 4 perform a compensation computation mainly including a double integral compensation computation for a signal corresponding to the vibration acceleration of the pedestal structure 91, which is detected by the vibration detection unit 3. According to such sky-hook spring control, vibration components other than those having the structural resonance frequency of the pedestal structure 91 can be reduced/suppressed.

Obviously, a compensation computation other than the above compensation computation, including nonlinear compensation, may be applied or used together by appropriately combining and using various signals such as an acceleration signal and velocity signal associated with vibrations, thereby controlling the vibrations of the pedestal structure 91 to an appropriate state.

In the apparatus according to this embodiment, as well, the compensation computation section 4 can also extract a frequency component to be controlled by performing appropriate filter processing for an output signal from the vibration detection unit 3 in addition to the compensation computation processing described above, or can perform processing such as providing rigidity to restore an inertial load 52 to a predetermined neutral position by using an active means.

The feedback control operation of the active vibration suppression apparatus according to this embodiment is implemented by controlling the linear-acting vibration suppression unit 50 on the basis of the signal obtained by the compensation computation section 4 that performs such a compensation computation.

Feedforward control operation using the feedforward compensation computation section 5 will be described next.

The feedforward compensation computation section 5 in this embodiment performs appropriate computation processing to make the linear-acting vibration suppression unit 50 effectively reduce/suppress vibrations produced in the pedestal structure 91 on the basis of a signal from the stage control section 46*b* or a signal associated with the driven state of a stage apparatus, such as the wafer stage 94 or reticle stage 95. The feedforward compensation computation section 5 performs compensation to generate a signal for canceling vibrations produced in the pedestal structure 91 by the operation of a stage apparatus in consideration of the dynamic characteristics between the drive reaction force for the stage apparatus and vibrations produced in the pedestal structure 91 when the drive reaction force is transmitted through the vibration isolation apparatus 92, the mechanical rigidity between the stage apparatus and the pedestal structure 91, and the like. Obviously, this compensation computation is not limited to a linear compensation computation, and a nonlinear computation can be applied as the compensation computation or used together.

The feedforward control operation of the active vibration suppression apparatus according to this embodiment is implemented by controlling the linear-acting vibration suppression unit 50 on the basis of the signal obtained by the feedforward compensation computation section 5 in this manner.

Although feedback control operation and feedforward control operation have been separately described, both feedback control operation and feedforward control operation can be simultaneously performed by driving the linear-acting vibration suppression unit 50 on the basis of the signal obtained by adding the two compensation computation results. Obviously, control may be performed by only one of the feedback control operation and feedforward control operation.

In the apparatus according to this embodiment, since the vibrations of the pedestal structure 91 are reduced by the active vibration suppression apparatus, the amount of vibrations transmitted from the apparatus mount pedestal 100 or pedestal structure 91 to the apparatus body through the vibration isolation apparatus 92 is suppressed to be low. As a consequence, this operation can contribute to the reduction/suppression of vibrations produced in the semiconductor exposure apparatus body.

As a method of reducing the amount of vibrations transmitted from the apparatus mount pedestal 100 or pedestal structure 91 to the apparatus body, a method of detecting the vibrations of the apparatus mount pedestal 100 or pedestal structure 91 by using a sensor, when an active vibration suppression apparatus is used as the vibration isolation apparatus 92, and controlling the active vibration suppression apparatus on the basis of the resultant compensation signal has been proposed/developed. This control arrangement corresponds to a form of feedforward control. In this case, a signal to be fed forward is a detection signal representing the vibrations of the apparatus mount pedestal, which is generated by a mechanism including many uncertainties. For this reason, control operation may become uncertain. This is a weak point in terms of the reliability of control operation. In feedforward control, any inappropriate signal to be fed forward simply becomes a disturbance.

The method described in this embodiment can obtain the same control effect as this type of feedforward control because the vibrations of the structure on the apparatus mount pedestal side are reduced. In addition, since control system operation is performed by feedback control on the vibrations of the pedestal structure 91 or feedforward control based on an operation signal from a stage apparatus that performs definite operation, uncertainties in the control operation are few as compared with feedforward control on the vibrations of the apparatus mount pedestal. Therefore, a desired vibration reducing/suppressing effect can be obtained and more reliable operation can be achieved.

<Embodiment of a Semiconductor Production System>

A production system for a semiconductor device (e.g., a semiconductor chip, such as an IC or LSI, a liquid crystal panel, a CCD, a thin-film magnetic head, micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 19:
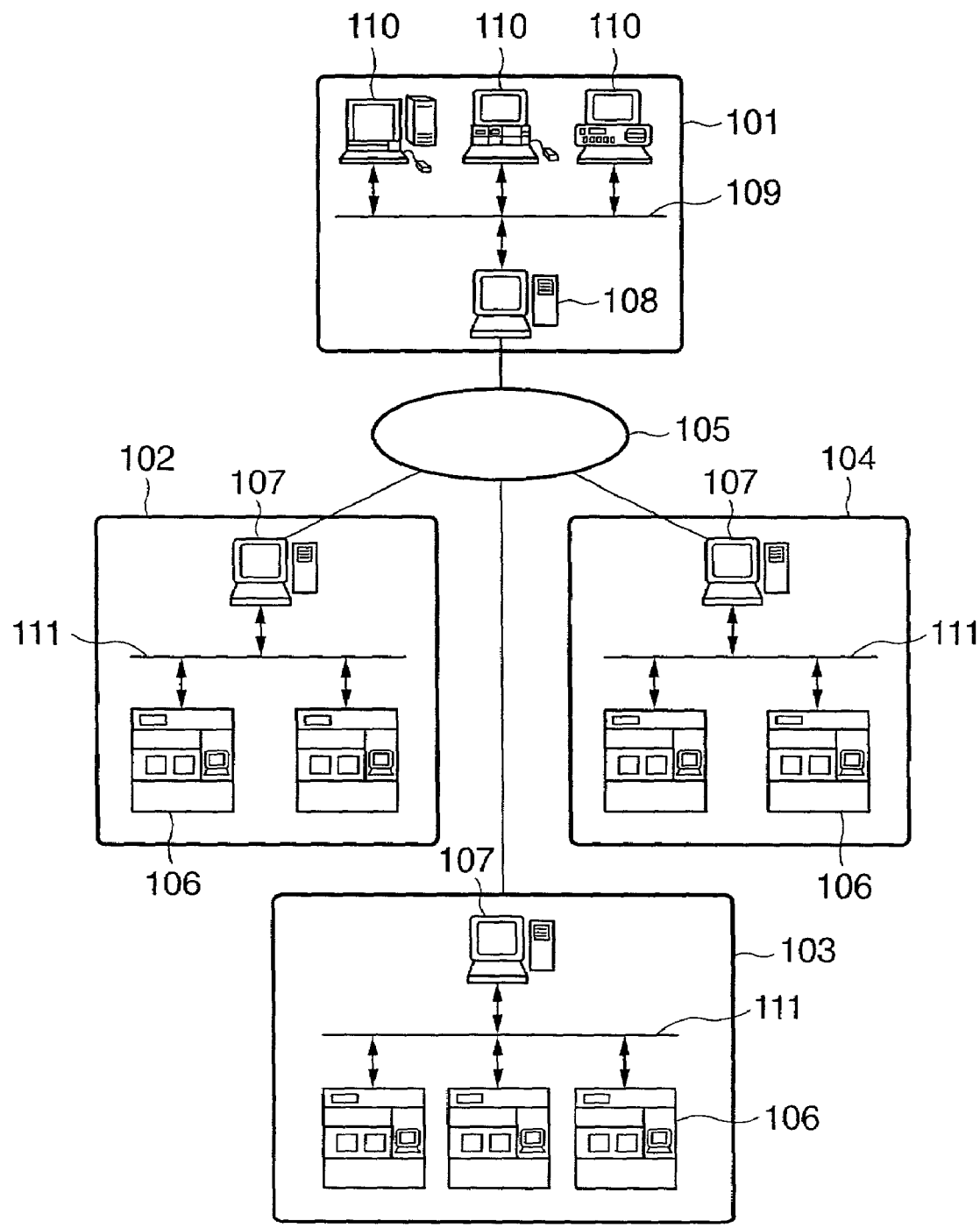
FIG. 19 is a view showing the concept of a semiconductor device production system using the apparatus according to the present invention when viewed from a given angle.

FIG. 19 shows the overall system cut out at a given angle. In FIG. 19, reference numeral 101 denotes a business office of a vendor (apparatus supply manufacturer), which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., lithography apparatus, including an exposure apparatus, a resist processing apparatus, or etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to build an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access to only a limited group of users. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., an ISDN) having high security which inhibits access of a third party, can be adopted. Also, the user may construct a database in addition to the one provided by the vendor and set the database on an external network, and the host management system may authorize access to the database from a plurality of user factories.

Figure 20:
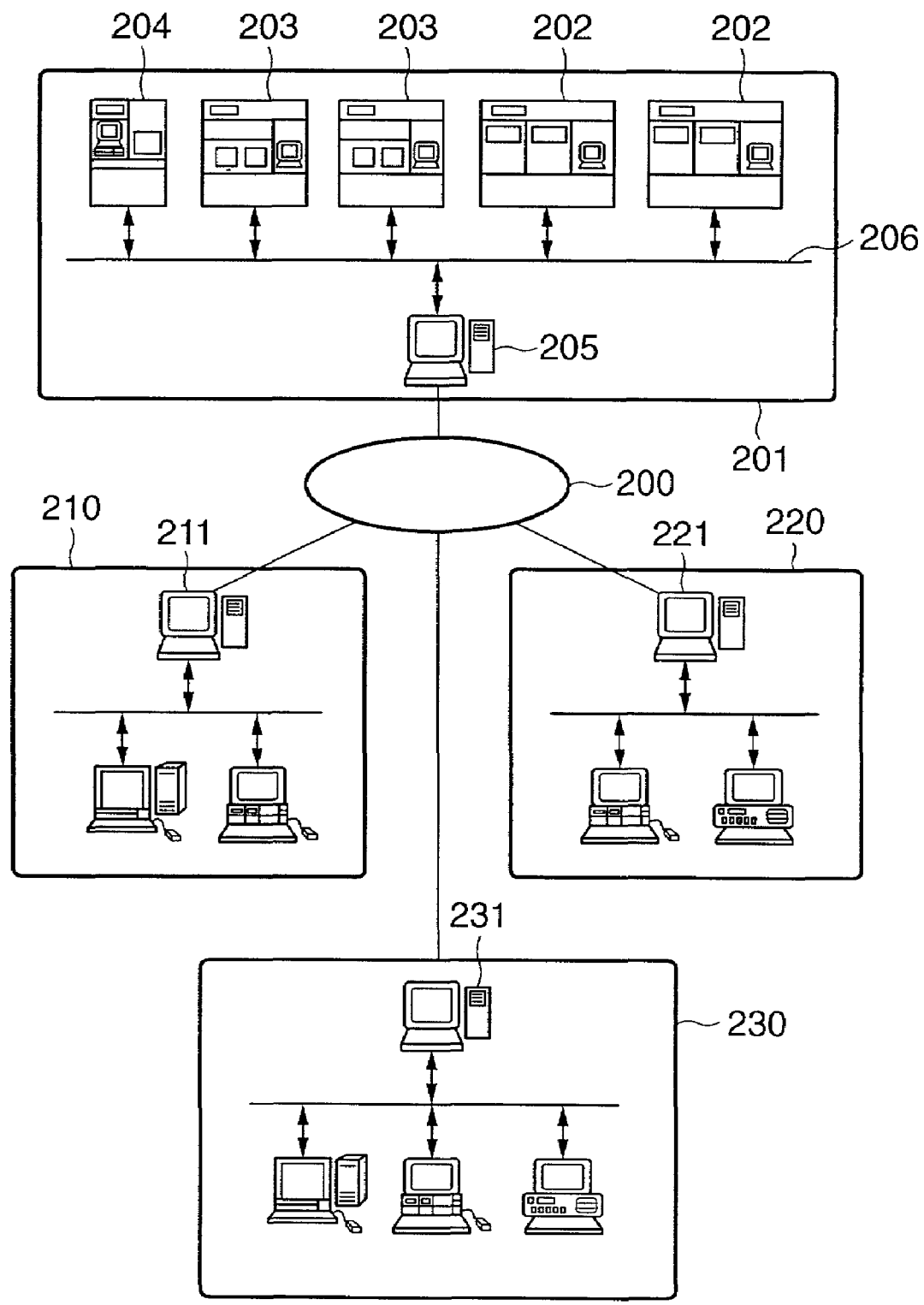
FIG. 20 is a view showing the concept of the semiconductor device production system using the apparatus according to the present invention when viewed from another given angle.

FIG. 20 is a view showing the concept of the overall system of this embodiment that is viewed at a different angle from FIG. 19. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 20, a factory having manufacturing apparatuses of a plurality of vendors and the management systems of the vendors for these manufacturing apparatuses are connected via the external network of the factory, and maintenance information of each manufacturing apparatus is communicated. In FIG. 20, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 20 shows only one manufacturing factory 201, but a plurality of factories are networked in practice. The respective apparatuses in the factory are connected to a LAN 206 to build an intranet, and a host management system 205 manages the operation of the manufacturing line.

The business offices of vendors (apparatus supply manufacturers), such as an exposure apparatus manufacturer 210, a resist processing apparatus manufacturer 220, and a film formation apparatus manufacturer 230, comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, a hard disk, or a network file server. The network access software includes a dedicated or general-purpose web browser, and provides a user interface having a window as shown in FIG. 21 on the display. While referring to this window, the operator who manages manufacturing apparatuses in each factory inputs, in input items on the windows, pieces of information such as the type of manufacturing apparatus 401, serial number 402, name of trouble 403, occurrence date 404, degree of urgency 405, symptom 406, remedy 407, and progress 408. The pieces of input information are transmitted to the maintenance database via the Internet, and appropriate maintenance information is sent back from the maintenance database and displayed on the display. The user interface provided by the web browser realizes hyperlink functions 410 to 412, as shown in FIG. 21. This allows the operator in the factory to access detailed information of each item, receive the latest-version software to be used for a manufacturing apparatus from a software library provided by a vendor, and receive an operation guide (help information) as a reference for the operator. Maintenance information provided by the maintenance database also includes information concerning the step driving profile of the projection exposure apparatus according to the present invention described above. The software library also provides the latest software for setting the step driving profile.

Figure 22:
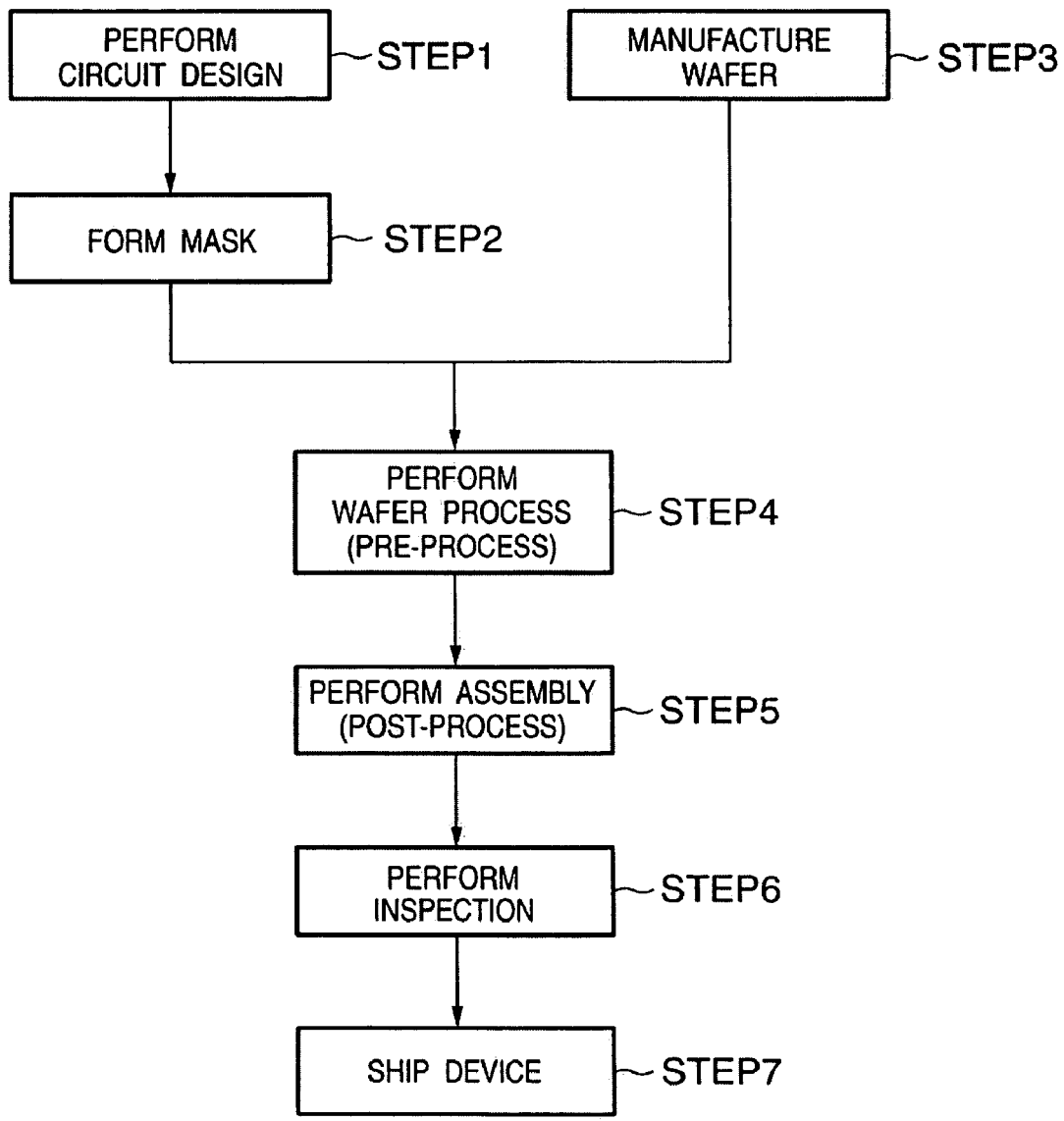
FIG. 22 is a flow chart showing the flow of a device manufacturing process.

A semiconductor device manufacturing process using the above-described production system will be explained. FIG. 22 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a pre-process, an actual circuit is formed on the wafer by lithography using the prepared mask and the wafer. Step 5 (assembly), called a post-process, is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5, are conducted. After these steps, the semiconductor device is completed and shipped (step 7). For example, the pre-process and post-process are performed in separate, dedicated factories, and maintenance is done for each of the factories by the above-described remote maintenance system. Information for production management and apparatus maintenance is communicated between the pre-process factory and the post-process factory via the Internet or dedicated network.

Figure 23:
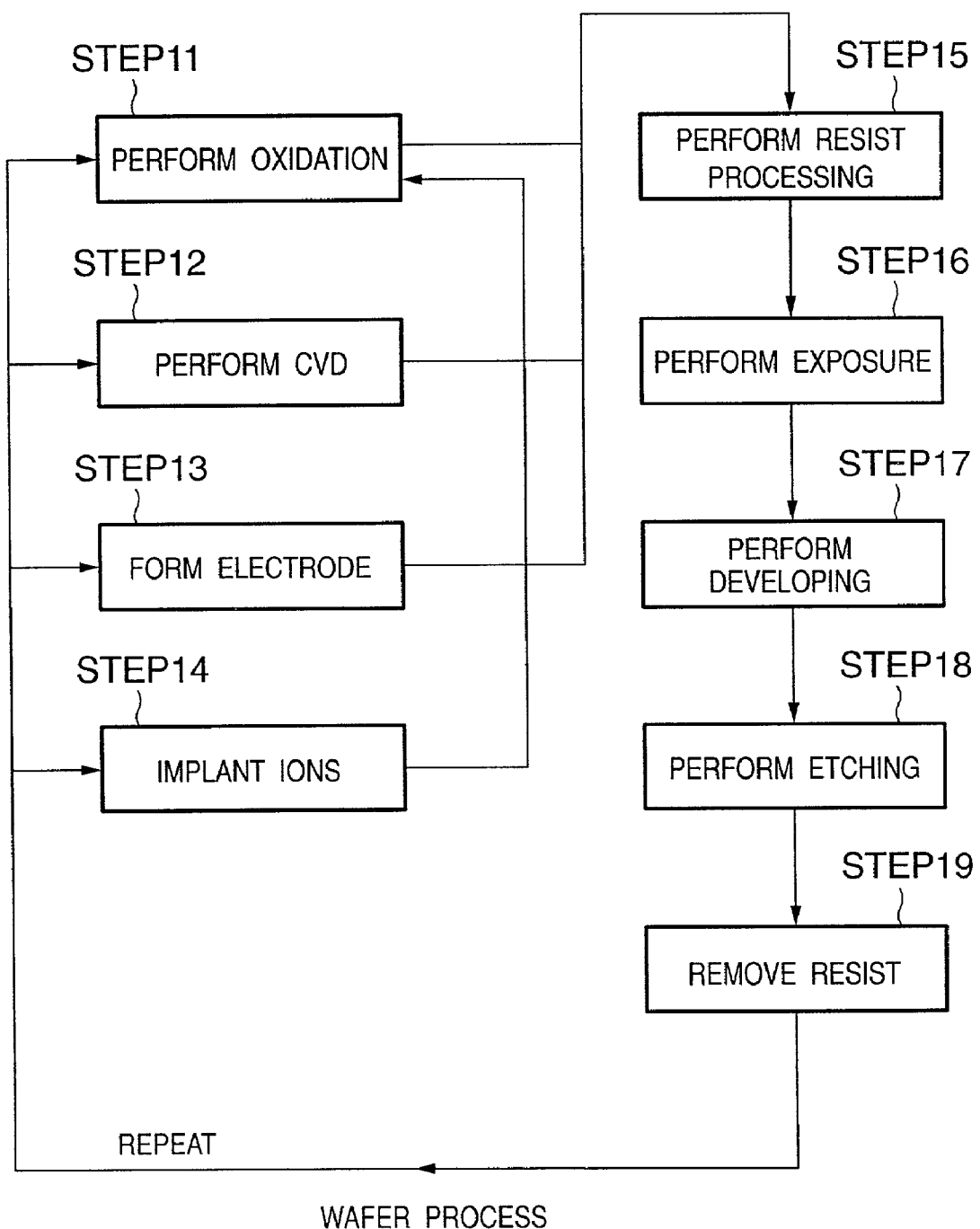
FIG. 23 is a flow chart for explaining a wafer process.

FIG. 23 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the exposure apparatus of the present invention described above exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, the active vibration suppression apparatus according to the present invention reduces/suppresses the vibrations of a vibration suppression target by using a vibration suppression unit using a reaction force generated when an inertial load is driven as a control force. That is, since the vibrations of the vibration suppression target are reduced without generating any unnecessary force outside the apparatus, no vibrations are produced in the apparatus mount pedestal or a peripheral environment by the reaction force of a force for reducing/suppressing vibrations. In addition, this apparatus is configured to obtain a force acting on a vibration suppression target by the drive reaction force of an inertial load in the control unit instead of generating it between external equipment and the vibration suppression target. If, therefore, a vibration suppression apparatus can be manufactured into an appropriate shape, a vibration reducing effect can be obtained by installing the vibration suppression apparatus in a place where a dashpot that has been used to reduce the structural resonance of equipment or a reinforcing member for ensuring rigidity cannot be mounted.

In addition, the active vibration suppression apparatus according to the present invention compensates for a detection signal representing the vibrations of a vibration suppression target, the operation state of equipment having a driving means, such as an X-Y stage, which may become a vibration source of the vibration suppression target, or a signal from a control section for the equipment by computation processing, including a nonlinear computation, and drives the vibration suppression unit on the basis of the resultant signal, thereby reducing/suppressing the vibrations of the vibration suppression target. Therefore, high vibration suppression performance can be ensured by a relatively high control gain with respect to vibrations that can be handled by a control force with which the operation of an inertial load in the vibration suppression unit falls within the allowable stroke range with a sufficient margin. If large vibrations are produced that make the inertial load undergo a stroke over, control operation, e.g., ensuring stable operation by suppressing a control signal to prevent the stroke over of the inertial load, can be performed. That is, even if severe restrictions are imposed on the movable stroke of an inertial load mass, and the like, both a vibration suppressing effect and stable operation upon inputting of large vibrations can be realized. Therefore, the maximum vibration suppression performance under the restrictions can be obtained.

The semiconductor exposure apparatus according to the present invention includes the active vibration suppression apparatus for reducing/suppressing the vibrations of a vibration suppression target by using the control unit which uses a reaction force generated when an inertial load is driven as a control force. With this arrangement, various types of structural vibrations can be reduced/suppressed, which cannot be handled by a conventional vibration isolation apparatus, based on the vibration isolation leg scheme. As a consequence, excellent exposure performance can be realized.

According to another aspect of the apparatus of the present invention, the vibrations of a pedestal structure serving as a pedestal when an exposure apparatus is installed on an apparatus mount pedestal are reduced/suppressed by using an active vibration suppression apparatus. This operation is equivalent to the reduction of the vibrations of the apparatus mount pedestal themselves. This makes it possible to reduce/suppress the amount of vibrations transmitted from the apparatus mount pedestal to the exposure apparatus through the vibration isolation apparatus, thus contributing to an improvement in the exposure performance of the apparatus. This apparatus and method take feedback control or feedforward control based on an operation signal from a stage apparatus that performs definite operation instead of feedforward control based on a signal generated by a mechanism with many uncertainties, such as feedforward control on the vibrations of the apparatus mount pedestal, which is implemented by using the conventional active vibration isolation apparatus. Therefore, this apparatus and method can realize vibration suppressing operation with high reliability.

As many widely different embodiments of the present invention can be made without departing from the spirit and scope thereof, it is to be understood that the invention is not limited to the specific embodiments thereof, except as defined in the claims.

The invention claimed is:

1. An active vibration suppression apparatus comprising:
   an actuator fixed to a vibration suppression target;
   an inertial load driven relative to the target by said actuator; and
   a driving system which drives said actuator based on a first signal corresponding to vibration, generated or to be generated, of the target, wherein said driving system comprises a compensation unit which performs a compensation for the first signal,
   wherein the compensation comprises:
   (i) a linear compensation for the first signal to obtain a first compensated signal, and
   (ii) a nonlinear compensation for the first compensated signal to obtain a second compensated signal, a rate of a change in the second compensated signal to a change in an absolute value of the first compensated signal becoming less with an increase of the absolute value.

2. An apparatus according to claim 1, wherein said actuator drives the inertial load in a straight direction.

3. An apparatus according to claim 1, further comprising a vibration detection unit which detects a vibration of the target and outputs a detected signal as the first signal.

4. An apparatus according to claim 1, wherein said compensation unit performs the compensation using a sigmoid function.

5. An apparatus according to claim 1, wherein said driving system uses, as the first signal, one of a driving signal for a stage which is supported by the target and moves relative to the target, and a signal concerning a driving state of the stage.

6. An apparatus according to claim 1, wherein the linear compensation comprises at least one of a proportional compensation, an integral compensation, a differential compensation, a phase-lead compensation, and a phase-lag compensation.

7. An apparatus according to claim 1, wherein said compensation unit performs the nonlinear compensation using one of a monotone increasing function and a monotone decreasing function.

8. An apparatus according to claim 1, wherein the compensation comprises the linear compensation and the nonlinear compensation as a composite compensation.

9. A method applied to an active vibration suppression apparatus, the apparatus comprising an actuator fixed to a vibration suppression target, and an inertial load driven relative to the target by the actuator, said method comprising:
   performing a compensation for a first signal corresponding to vibration, generated or to be generated, of the target, wherein the compensation comprises:
   (i) a linear compensation for the first signal to obtain a first compensated signal; and
   (ii) a nonlinear compensation for the first compensated signal to obtain a second compensated signal, a rate of a change in the second compensated signal to a change in an absolute value of the first compensated signal becoming less with an increase of the absolute value; and
   driving the actuator based on the second compensated signal obtained in said performing step.

10. A method according to claim 9, wherein the compensation comprises the linear compensation and the nonlinear compensation as a composite compensation.

* * * * *